(12) United States Patent
Chen

(10) Patent No.: US 9,461,239 B2
(45) Date of Patent: Oct. 4, 2016

(54) METHOD OF HEATING, METHOD OF PRODUCING PIEZOELECTRIC FILM, AND LIGHT IRRADIATION DEVICE

(71) Applicant: Xianfeng Chen, Kanagawa (JP)

(72) Inventor: Xianfeng Chen, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 222 days.

(21) Appl. No.: 14/160,701

(22) Filed: Jan. 22, 2014

(65) Prior Publication Data

US 2014/0216643 A1  Aug. 7, 2014

(30) Foreign Application Priority Data

Feb. 5, 2013  (JP) .................................. 2013-020389

(51) Int. Cl.
| | |
|---|---|
| *H01L 41/314* | (2013.01) |
| *H01L 41/318* | (2013.01) |
| *H01L 41/331* | (2013.01) |
| H01L 41/09 | (2006.01) |
| H01L 41/187 | (2006.01) |

(52) U.S. Cl.
CPC ........... *H01L 41/314* (2013.01); *H01L 41/318* (2013.01); *H01L 41/331* (2013.01); *H01L 41/0973* (2013.01); *H01L 41/1876* (2013.01)

(58) Field of Classification Search
CPC .. H01L 41/314; H01L 41/331; H01L 41/318
See application file for complete search history.

(56) References Cited

U.S. PATENT DOCUMENTS

| | | | | |
|---|---|---|---|---|
| 5,699,035 A | * | 12/1997 | Ito | ...................... C23C 16/45561 |
| | | | | 257/E21.009 |
| 6,535,535 B1 | * | 3/2003 | Yamazaki | .......... G02B 19/0014 |
| | | | | 257/E21.134 |
| 2002/0126185 A1 | * | 9/2002 | Murai | .................. B41J 2/14233 |
| | | | | 347/68 |
| 2003/0162463 A1 | * | 8/2003 | Hayashi | .............. H01L 21/6835 |
| | | | | 445/24 |
| 2005/0087289 A1 | * | 4/2005 | Toyoda | .................... B32B 38/10 |
| | | | | 156/230 |
| 2005/0175882 A1 | * | 8/2005 | Sasahara | ............. H01M 4/8605 |
| | | | | 427/115 |
| 2007/0037346 A1 | * | 2/2007 | Grant | ....................... H01G 4/33 |
| | | | | 438/243 |
| 2013/0169713 A1 | | 7/2013 | Takeuchi et al. | |

FOREIGN PATENT DOCUMENTS

| | | |
|---|---|---|
| JP | 2001-291666 | 10/2001 |
| JP | 2009238842 A * | 10/2009 |
| WO | 2008/004571 | 1/2008 |

OTHER PUBLICATIONS

S. S. N. Bharadwaja et al., "Highty textured laser annealed Pb(Zr0.52Ti0.48)O3 thin films", Applied Physics Letter, 99, 042903(2011).
Jun Jiang et al., "Ferroeleotric Properties of Lead Zirconate. Titanate Thin Film on Glass Substrate Crystallized by Continuous-Wave Green Laser Annealing", Japanese Journal of Applied Physics, 49. 04DH14(2010).

* cited by examiner

*Primary Examiner* — Daniel McNally
(74) *Attorney, Agent, or Firm* — IPUSA, PLLC

(57) ABSTRACT

A method of heating includes a process of forming a layer to be heated on one surface of a light absorption layer; and a process of heating the light absorption layer by irradiating light onto the other surface of the light absorption layer. The other surface of the light absorption layer is a surface opposite to the one surface of the light absorption layer.

16 Claims, 13 Drawing Sheets

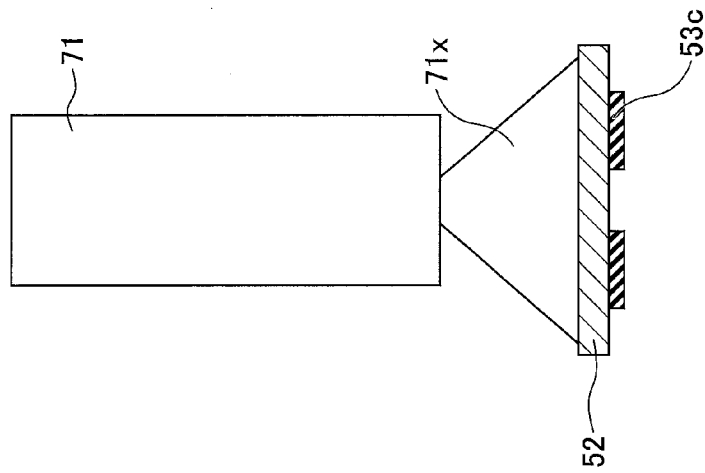
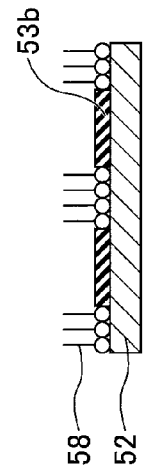
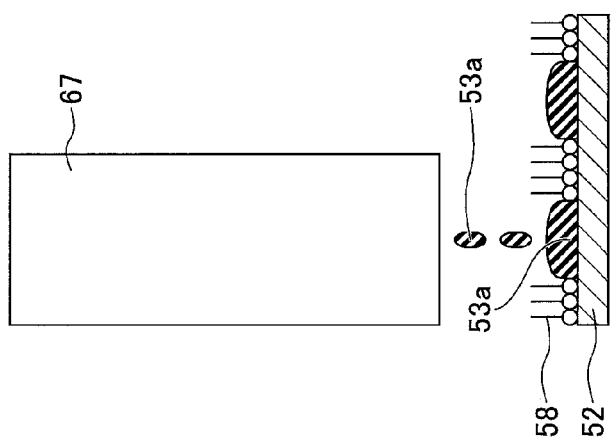
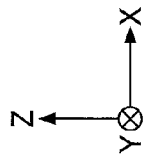

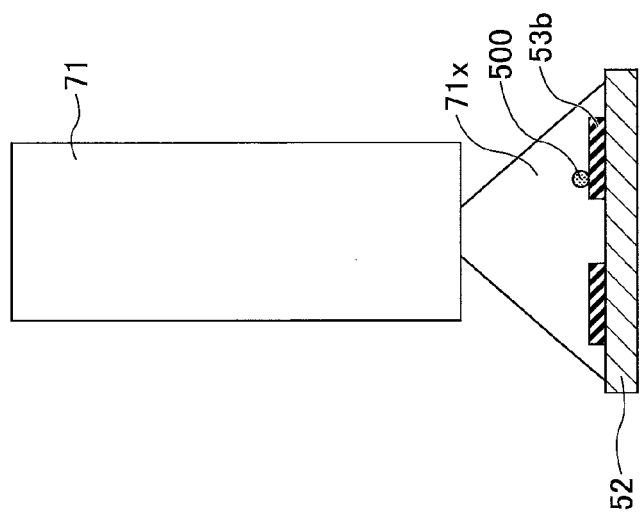
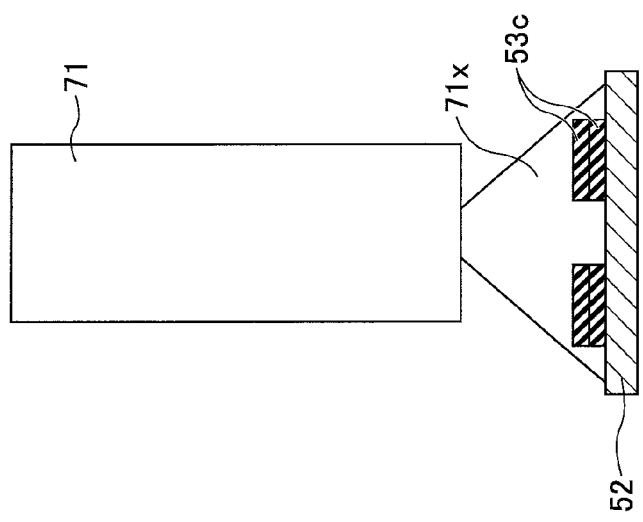
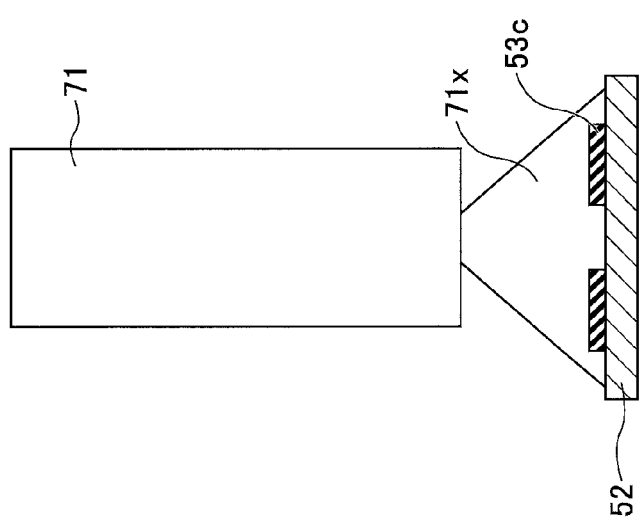

METHOD OF HEATING, METHOD OF PRODUCING PIEZOELECTRIC FILM, AND LIGHT IRRADIATION DEVICE

BACKGROUND OF THE INVENTION

1. Field of the Invention

The present invention relates to a method of heating a film, a method of producing a piezoelectric film and a piezoelectric element, a liquid droplet discharge head, a liquid droplet discharge device, and a light irradiation device.

2. Description of the Related Art

An electric furnace and a Rapid Thermal Annealing (RTA) device have been used for a process of heating a film that is formed on a substrate. In the process, the film is heated to be a temperature that is greater than or equal to a predetermined temperature for a fixed time period. In such a heating process, not only the film, but also the whole substrate is heated.

Some conditions may be imposed for heating the whole substrate. For example, a heat resistant substrate may be required. When another structure and/or an element is disposed on the substrate, a member other than the substrate (e.g., the other structure and/or the element) is also heated, despite that the heating process may not be required for such a member. In such a case, deviation of dimensional precision may be caused, for example, by thermal damage or thermal stress, and performance of the film may be significantly degraded.

As for a silicon device, a heating process by laser irradiation may be applied so as to form a polycrystalline silicon film of a solar cell, or so as to activate a foreign material in an ion implantation layer in a power device, for example. In such a heating process by laser irradiation, a laser beam is directly irradiated onto an object to be heated, so that energy is absorbed by the object. The object is molten once, and subsequently the object is recrystallized. The heating process by laser irradiation may be applied for such a purpose.

The heating process by laser irradiation may be applied for producing an oxide piezoelectric film (e.g., the PZT film). For example, Non-Patent Document 1 ("Highly textured laser annealed Pb(Zr0.52Ti0.48)O3 thin films," Applied Physics Letters, 99, 042903 (2011)) discloses that a PZT film in an amorphous state, which is formed by a sputtering method, is crystallized by irradiation of a KrF excimer pulsed laser beam.

Furthermore, for example, Non-Patent Document 2 ("Ferroelectric properties of Lead Zirconate Titanate thin film on glass substrate crystallized by continuous-wave green laser annealing," Japanese Journal of Applied Physics, 49, 04DH14 (2010)) discloses that a heating process of 350° C. is applied to a PZT film that is formed by a sol-gel method on a quartz substrate having a platinum electrode and a titanium layer. Subsequently, a continuous-wave green laser beam having a wavelength of 532 nm is irradiated onto a surface side (i.e., the side on which the PZT film is formed) of the quartz substrate, and the PZT film is crystallized by heating the platinum electrode.

SUMMARY OF THE INVENTION

According to an aspect of the present invention, there is provided a method of heating including a process of forming a layer to be heated on one surface of a light absorption layer; and a process of heating the light absorption layer by irradiating light onto the other surface of the light absorption layer, wherein the other surface of the light absorption layer is a surface opposite to the one surface of the light absorption layer.

According to another aspect of the present invention, there is provided a method of producing a piezoelectric film including a process of forming a complex oxide film on a lower electrode film, wherein the lower electrode film is a light absorption layer formed on one surface of a support substrate; and a process of heating the lower electrode film by irradiating light that passes through the support substrate onto the lower electrode film from the other surface of the support substrate, wherein the other surface of the support substrate is a surface opposite to the one surface of the support substrate.

According to another aspect of the present invention, there is provided a light irradiation device including a light emitter configured to emit light onto a light absorption layer, wherein a layer to be heated is formed on one surface of the light absorption layer, wherein the light emitter emits the light onto the light absorption layer from the other surface of the light absorption layer, and wherein the other surface of the light absorption layer is a surface opposite to the one surface of the light absorption layer.

BRIEF DESCRIPTION OF THE DRAWINGS

FIGS. 10A-10C are diagrams exemplifying a remaining process of the example of the method of producing the piezoelectric film according to the embodiment;

FIGS. 11A-11C are diagrams exemplifying a method of producing a piezoelectric film according to a comparative example;

DETAILED DESCRIPTION OF THE PREFERRED EMBODIMENTS

Figure 1A:
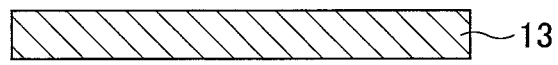
FIGS. 1A-1C are cross-sectional views illustrating an example of a method of heating according to an embodiment of the present invention.

According to the method disclosed in Non-Patent Document 1, when the PZT film is heated by the KrF excimer pulsed laser beam, almost all the laser beam is absorbed by a surface of the PZT film, and a portion of the PZT film in the vicinity of the surface is crystallized by diffusion of the heat generated on the surface. Accordingly, when the temperature of the surface is high, some portion of Pb, which tends to be evaporated, escapes from the PZT film, and composition deviation may occur in the formed PZT crystalline film.

According to the method disclosed in Non-Patent Document 2, the reflectance of the PZT film varies, as the thickness of the PZT film is varied. Thus, when the thickness of the PZT film is varied, energy of a laser beam absorbed by the surface of the platinum electrode varies. Accordingly, for a PZT film having a multilayer structure or a predetermined surface shape (i.e., the film thickness is not fixed), it may be difficult to control an amount of energy of the laser beam absorbed by the surface of the platinum electrode, due to effect of the surface and/or effect of an interface.

There is a need for a heating method with which an amount of absorbed energy of irradiated light can be easily controlled. According to the embodiment, such a heating method can be provided.

Hereinafter, the embodiment for implementing the present invention is explained by referring to the accompanying drawings. In the drawings, identical reference numerals may be attached to identical elements, and thereby overlapped explanations may be omitted.

Hereinafter, an example of a heating method is explained. In the heating method, an amorphous PZT film (i.e., a non-crystalline PZT film) that is formed on a platinum film (a Pt film) is crystallized. Here, the platinum film is a light absorption layer, and the amorphous PZT film is a layer to be heated. A solid solution of lead zirconate ($PbZrO_3$) and lead titanate ($PbTiO_3$) may be referred to as "PZT." Physical properties of PZT depend on a ratio between $PbZrO_3$ and $PbTiO_3$. For example, a specific type of PZT can be utilized such that the ratio between $PbZrO_3$ and $PbTiO_3$ is 53:47. Such a specific type of PZT may be represented by a chemical formula of $Pb(Zr_{0.53}, Ti_{0.47})O_3$. More generally, the specific type of PZT may be denoted as PZT (53/47).

Figure 1B:
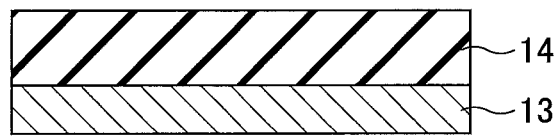
Figure 1C:
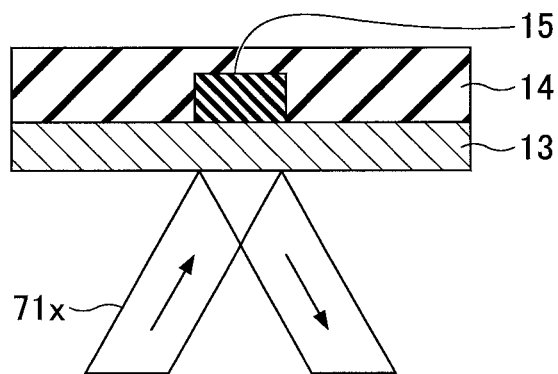

FIGS. 1A-1C are cross-sectional views illustrating the example of the heating method according to the embodiment. In the process shown in FIG. 1A, a platinum film 13 is prepared as a light absorption layer. A film thickness of the platinum film 13 may be a thickness that is sufficient for absorbing a irradiated laser beam. For example, the film thickness of the platinum film 13 may be approximately 100 nm.

Subsequently, in the process shown in FIG. 1B, an amorphous PZT film 14 is formed on one surface of the platinum film 13. Here, the platinum film 13 is the light absorption layer, and the amorphous PZT film 14 is the layer to be heated. The amorphous PZT film 14 may be formed on the one surface of the platinum film 13, for example, by using a sputtering method or a Chemical Solution Deposition (CSD) method. In the example, the amorphous PZT film 14 is directly formed on the one surface of the platinum film 13 that is the light absorption layer. A film thickness of the amorphous PZT film 14 may be approximately 60 nm, for example.

When the amorphous PZT film 14 is formed by the CSD method, as a starting material, for example, a mixture of lead acetate, a zirconium alkoxide compound, and a titanium alkoxide compound may be utilized. The starting material is dissolved in methoxyethanol that is used as a common solvent. In this manner, a homogeneous solvent is prepared. This homogeneous solvent is referred to as a "PZT precursor solution." In the PZT precursor solution, concentration of the complex oxide may be adjusted to be from 0.1 mol/l to 0.7 mol/l, for example. A mixing ratio among lead acetate, the zirconium alkoxide compound, and the titanium alkoxide compound may be suitably selected, depending on desired composition of a type of PZT (i.e., a ratio between $PbZrO_3$ and $PbTiO_3$). For example, a mixing ratio among lead acetate, a zirconium alkoxide compound, and a titanium alkoxide compound may be suitably selected for the above-described PZT (53/47).

Next, a coating film is formed by applying the PZT precursor solution onto one surface of the platinum film 13 by using a spin coating method, for example. Then, a heating process is applied to the coating film for about one minute by using a hot plate of approximately 120° C. After that, another heating process is applied to the coating film for about one minute to ten minutes by using a hot plate of approximately from 180° C. to 500° C. In this manner, an amorphous PZT film 14 is formed on the one surface of the platinum film 13.

Next, in the process shown in FIG. 10, the other surface of the platinum film 13 (i.e., the surface on which the amorphous PZT film 14 is not formed) is locally irradiated by a continuous wave laser beam 71x, for example. Here, the other surface of the platinum film 13 (i.e., the light absorption layer) is the surface of the platinum film 13 opposite to the one surface of the platinum film 13.

As for a wavelength of the laser beam 71x, a wavelength may be suitably selected which can be easily absorbed by the platinum film 13 as the light absorption layer. In this example, the wavelength of the laser beam 71x may be approximately 980 nm. A spot shape of the laser beam 71x may be an approximately rectangular shape, for example. In such a case, the size of the approximately rectangular shape may be about 0.35 mm×1 mm, for example.

The platinum film 13 has a significantly large absorption coefficient with respect to light having a wavelength of approximately 980 nm. The absorption coefficient is approximately $7 \times 10^5$ $cm^{-1}$. For example, for the platinum film 13 having the film thickness of 100 nm, a light transmittance with respect to light having a wavelength of approximately 980 nm is less than or equal to one percent. Accordingly, when the laser beam 71x having the wavelength of approximately 980 nm is irradiated onto the platinum film 13, almost all the light energy of the laser beam 71x is absorbed by the platinum film 13. In FIG. 1C, the laser beam 71x is obliquely irradiated onto the platinum film 13. However, the laser beam 71x may be perpendicularly irradiated onto the platinum film 13.

The light energy of the laser beam 71x absorbed by the platinum film is converted into heat, and the platinum film 13 is heated. The heat of the platinum film 13 is conducted (diffuses) to the amorphous PZT film 14 that is formed on the one surface of the platinum film 13. The amorphous PZT film 14 is locally heated from the surface of the platinum film 13. In the heated portion of the amorphous PZT film 14, film properties are converted (i.e., the film is crystallized), and thereby crystalline PZT 15 is formed.

In general, a crystallization temperature of an amorphous PZT film is approximately from 600° C. to 800° C. The crystallization temperature of the amorphous PZT film is significantly lower than a melting point of platinum (which is 1768° C.). Accordingly, by controlling the energy density and the irradiation time of the laser beam 71x to be irradiated onto the platinum film 13, the amorphous PZT film 14 can be locally heated and crystallized without damaging the platinum film 13. The energy density of the laser beam 71x may be adjusted to be approximately from $1\times10^2$ W/cm$^2$ to $1\times10^6$ W/cm$^2$, for example. The irradiation time of the laser beam 71x may be adjusted to be approximately from 1 ms to 200 ms, for example.

In FIG. 1C, the amorphous PZT film 14 is still remaining on the crystalline PZT 15. However, by controlling the energy density and the irradiation time of the laser beam 71x, the remaining amorphous PZT film 14 can be converted into the crystalline PZT 15.

As described above, in this example of the heating method, the amorphous PZT film 14 (which is the layer to be heated) is formed on the one surface of the platinum film 13 (which is the light absorption layer). Then, the other surface of the platinum film 13 is locally irradiated by the laser beam 71x having the wavelength that can be easily absorbed by the platinum film 13.

By doing this, the platinum film 13 (which is the light absorption layer) absorbs light energy of the laser beam 71x, and the platinum film 13 is locally heated. Since the amorphous PZT film 14 is laminated on the light absorption layer, the amorphous PZT film 14 is also locally heated. The film properties of the portion of the amorphous PZT film 14 that is locally heated are converted (crystallized), and thereby the crystalline PZT 15 can be formed.

By the heating method according to this example, the crystalline PZT 15 can be locally formed of the amorphous PZT film 14 (which is the layer to be heated), almost without thermally affecting the platinum film 13 that is the light absorption layer. Namely, the amorphous PZT film 14 (which is the layer to be heated) can be locally heated and crystallized.

When this heating method is applied to a device having a structure and/or an element other than a layer to be heated, a member other than the layer to be heated (e.g., the structure and/or the element) may not be significantly heated. Here, the heating process may not be required for the member other than the layer to be heated. Accordingly, deviation of dimensional precision may not be easily caused by thermal damage or thermal stress, and degradation of the performance of the device may be avoided.

The heating method according to this example may preferably be applied to a device having a structure and/or an element other than a layer to be heated, such as a sensor or an actuator. Especially, the heating method according to this example may preferably be applied to a micro device in which precise control is performed.

In the above explanation, the continuous-wave laser beam 71x is irradiated onto the platinum film 13 that is the light absorption layer. However, the embodiment is not limited to this, and a pulsed-wave laser beam may be irradiated, instead of the continuous-wave laser beam 71x.

In the above explanation, the amorphous PZT film 14 (which is the layer to be heated) is laminated on the one surface of the platinum film 13, which is the light absorption layer. However, the light absorption layer is not limited to this, and a heat resistant film having a melting point of greater than or equal to 1000° C. may be utilized as the light absorption layer. As an example of the heat resistant film, a metal film may be considered that includes any one metal of Ir, Pd, Rh, W, Fe, Ni, Ta, Cr, Zr, Ti, and Au. As another example of the heat resistant film, a metal alloy film may be considered that includes an alloy of any of the above-described metals. As further example of the heat resistant film, a laminated film may be considered that is formed by suitably selecting the metal film or the metal alloy film, and laminating a plurality of the selected films. In the above explanation, the amorphous PZT film 14 is used as the layer to be heated. However, the layer to be heated is not limited to this, and a film formed of a material other than "PZT," such as BaTiO$_3$ or Si, may be utilized, instead of the amorphous PZT film 14. For example, a laser beam may be irradiated onto a microcrystal of Si, and thereby a particle diameter of a crystal grain may be increased.

Hereinafter, another example of the heating method is explained. In this example of the heating method, an amorphous PZT film that indirectly contacts a platinum film as a light absorption layer is crystallized.

Figure 2A:
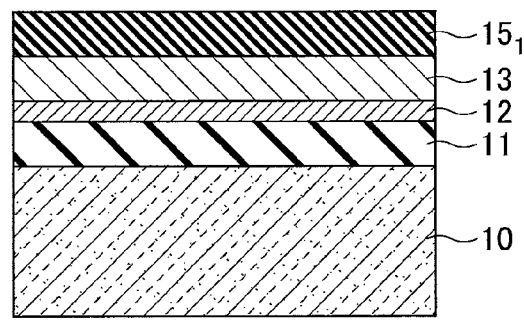
FIGS. 2A-2C are cross-sectional views illustrating another example of the method of heating according to the embodiment.
Figure 2B:
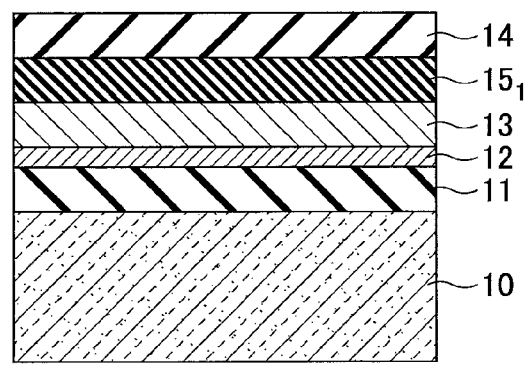
Figure 2C:
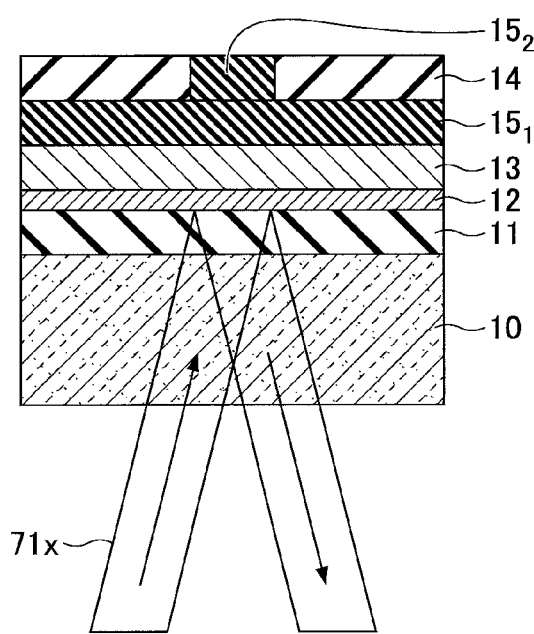

FIGS. 2A, 2B, and 2C are cross-sectional views illustrating the heating method according to this example. In the process shown in FIG. 2A, a silicon substrate 10 is prepared. The silicon substrate 10 has a thickness of approximately 650 μm, and the silicon substrate 10 is utilized as a support substrate. Then, by a known method, a silicon oxide film (SiO$_2$ film) 11 having a film thickness of approximately 600 nm, a titanium film (Ti film) 12 having a film thickness of approximately 20 nm, and a platinum film 13 having a film thickness of approximately 100 nm are sequentially laminated on one surface of the silicon substrate 10. Subsequently, crystalline PZT 15$_1$ is laminated onto the platinum film 13. Here, the silicon substrate 10 is doped in advance with a foreign material of boron (B) of approximately $10\times10^{17}$/cm$^3$.

Subsequently, in the process of FIG. 2B, the amorphous PZT film 14 is formed on the crystalline PZT 15$_1$, for example, by using the sputtering method or the Chemical Solution Deposition (CSD) method. The film thickness of the amorphous PZT film 14 may be approximately 60 nm, for example.

Subsequently, in the process shown in FIG. 2C, a continuous-wave laser beam 71x (which has the wavelength of approximately 1400 nm, for example) is locally irradiated onto the structure shown in FIG. 2B from the other surface of the silicon substrate 10 (i.e., the surface of the silicon substrate 10 on which the silicon oxide film 11 is not formed). The energy density of the laser beam 71x may be approximately $1\times10^2$ W/cm$^2$ to $1\times10^6$ W/cm$^2$, for example. Irradiation time of the laser beam 71x may be from 1 ms to 200 ms, for example.

The silicon substrate 10 and the silicon oxide film 11 are transparent with respect to light having a wavelength of approximately 1400 nm. Accordingly, 90% or more of the light energy of the laser beam 71x that enters the silicon substrate 10 is absorbed by a light absorption layer formed of the laminated layer of the titanium film 12 and the platinum film 13.

In this manner, the light absorption layer may have a structure such that heat resistant metal films having corresponding melting points of greater than or equal to 1000° C. are laminated (in this example, the light absorption layer is formed of the laminated film in which the titanium film 12 and the platinum film 13 are laminated). As described above, as the light absorption layer, a metal film may be utilized that includes any one metal of Ir, Pd, Rh, W, Fe, Ni, Ta, Cr, Zr, and Au. Alternatively, as the light absorption layer, a metal alloy film may be utilized that includes an alloy of at least one metal of the above-described metals. Alternatively, as the light absorption layer, a laminated film may be utilized that is formed by suitably selecting the metal film or the metal alloy film, and laminating a plurality of the selected films.

The light energy of the laser beam $71x$ absorbed by the light absorption layer is converted into heat, and the titanium film 12 and the platinum film 13 are heated. Here, as described above, the light absorption layer is formed of a laminated film in which the titanium film 12 and the platinum film 13 are laminated. The heat of the titanium film 12 and the platinum film 13 is conducted (diffuses) to the crystalline PZT $15_1$ and to the amorphous PZT film 14, which are formed on the one surface of the platinum film 13. In this manner, the crystalline PZT $15_1$ and the amorphous PZT film 14 are locally heated from the surface of the platinum film 13. The film properties of the heated portion of the crystalline PZT $15_1$ are converted (i.e., a diameter of a crystal grain increases), and the crystal quality is enhanced. Similarly, the film properties of the heated portion of the amorphous PZT film 14 are converted (i.e., crystallized), and thereby crystalline PZT $15_2$ is formed.

As described above, in the heating method according to this example, the laminated film of the titanium film 12 and the platinum film 13 is formed, as the light absorption layer, on the one surface of the silicon substrate 10. Subsequently, the laser beam $71x$ having the wavelength that is easily absorbed by the laminated film of the titanium film 12 and the platinum film 13 is locally irradiated onto the laminated film of the titanium film 12 and the platinum film 13 (which is the light absorption layer) from the other surface of the silicon substrate 10.

By doing this, the laminated film of the titanium film 12 and the platinum film 13 (i.e., the light absorption layer) absorbs the light energy of the laser beam $71x$, and the laminated film of the titanium film 12 and the platinum film 13 are locally heated. Consequently, the crystalline PZT $15_1$ and the amorphous PZT film 14 that are laminated on the light absorption layer are locally heated.

The film properties of the locally heated portion of the crystalline PZT $15_1$ are converted (i.e., a diameter of a crystal grain increases), and the crystal quality is enhanced. The film properties of the locally heated portion of the amorphous PZT film 14 are converted (i.e., crystallized), and thereby crystalline PZT $15_2$ is formed.

The heating method according to this example may be advantageous in the following points, in addition to the advantages of the heating method according to the previously described example.

Suppose that a plurality of crystalline films are to be laminated by forming a crystalline film by crystallizing an amorphous film by irradiating a laser beam and subsequently repeating the formation of an amorphous film and crystallization of the amorphous film by irradiation of the laser beam.

In such a case, if a laser beam were to be irradiated from the surface of the light absorption layer on which the amorphous film is formed, a light absorption rate of the layer on which the laser beam is to be irradiated would vary due to the difference in the total thickness of the film, between the time of forming a lower layer of the crystalline film and the time of forming an upper layer of the crystalline film. Accordingly, in order to adjust the temperature of the amorphous film to be crystallized at the time of forming the upper layer crystalline film to be equal to the temperature of the amorphous film to be crystallized at the time of forming the lower layer crystalline film, the power of the laser to be irradiated may be adjusted depending on the total thickness of the film.

In such a case, a relationship between the total thickness of the layer on which the laser beam is to be irradiated and the light absorption rate may be determined in advance by measurement. The power of the laser beam may be adjusted based on the relationship. However, if the power of the laser beam to be irradiated were adjusted depending on the total thickness of the layer to which the laser beam is to be irradiated, the producing process could be extremely complicated. Moreover, when the condition of the actually formed film is not ideal (e.g., unevenness in the film thickness), the setting based on the measurement performed in advance may not be optimum, and a crystalline film having uniform crystallinity may not be formed.

When an amorphous film is formed on one surface of a light absorption layer, and when a laser beam is irradiated onto the light absorption layer from the other surface of the light absorption layer (as in the case of this example), the light absorption layer is heated by the laser beam, and the heat of the light absorption layer is conducted (diffuses) to the amorphous film. In this manner, the amorphous film is heated, and the amorphous film is crystallized. In this case, almost all the laser beam is absorbed by the light absorption layer, and almost no laser beam passes through the light absorption layer and reaches the amorphous film. Accordingly, even if a plurality of crystalline films and amorphous films are laminated and the total thickness of the film is varied, it may not be necessary to consider the effect of the variation of the light absorption rate.

Namely, as in the case of this example, when the laser beam is irradiated onto the light absorption layer from the other surface of the light absorption layer, the amorphous film can be crystallized by irradiating the laser beam of fixed power, irrespective of the thickness of the film formed on the one surface of the light absorption layer. In other words, by the heating method according to this example, the energy of the laser beam to be irradiated can be easily controlled, without considering the thickness of the film formed on the one surface of the light absorption layer. As a consequence, a crystalline film having uniform crystallinity can be formed.

In the above explanation, the continuous-wave laser beam $71x$ is irradiated onto the silicon substrate 11 and the like. However, the embodiment is not limited to this, and a pulsed-wave laser beam may be irradiated, instead of the continuous-wave laser beam $71x$. The wavelength of the laser beam $71x$ is not limited to 1400 nm. The laser beam $71x$ having a wavelength other than 1400 nm may be utilized, provided that the wavelength is greater than or equal to 1200 nm.

In the above explanation, the amorphous film 14 is laminated onto the platinum film 13. However, as described above, a metal film including any one metal of Ir, Pd, Rh, W, Fe, Ni, Ta, Cr, Zr, Ti, and Au may be utilized as the light absorption layer, instead of the platinum film 13. Alternatively, as the light absorption layer, a metal alloy film may be utilized that includes an alloy of at least one metal of the above-described metals. Alternatively, as the light absorption layer, a laminated film may be utilized that is formed by suitably selecting the metal film or the metal alloy film, and laminating a plurality of the selected films. In the above explanation, the amorphous PZT film 14 is used. However, a film formed of a material other than "PZT" may be utilized, such as a film formed of $BaTiO_3$ or Si.

For convenience of the explanation, the different reference numerals are utilized for the crystalline PZT $15_1$ and the crystalline PZT $15_2$. However, the compositions of the crystalline PZT $15_1$ and the crystalline PZT $15_2$ may be the same.

Hereinafter, another example of the heating method is explained. In this example of heating method, a laser beam is irradiated onto a light absorption layer, while moving a position of the laser beam relative to a position of the light absorption layer. In this manner, the whole surface of an amorphous PZT film is crystallized.

Figure 3A:
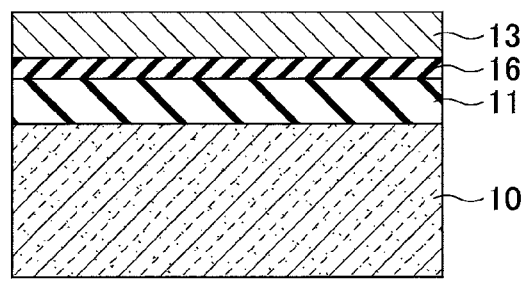
FIGS. 3A-3C are cross-sectional views illustrating another example of the method of heating according to the embodiment.
Figure 3B:
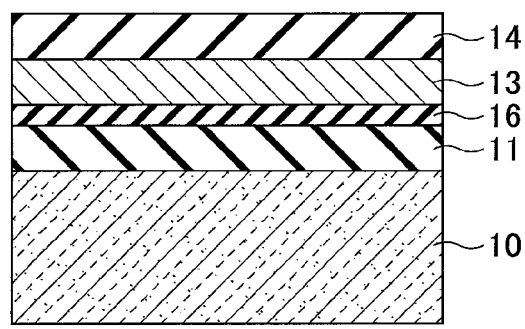
Figure 3C:
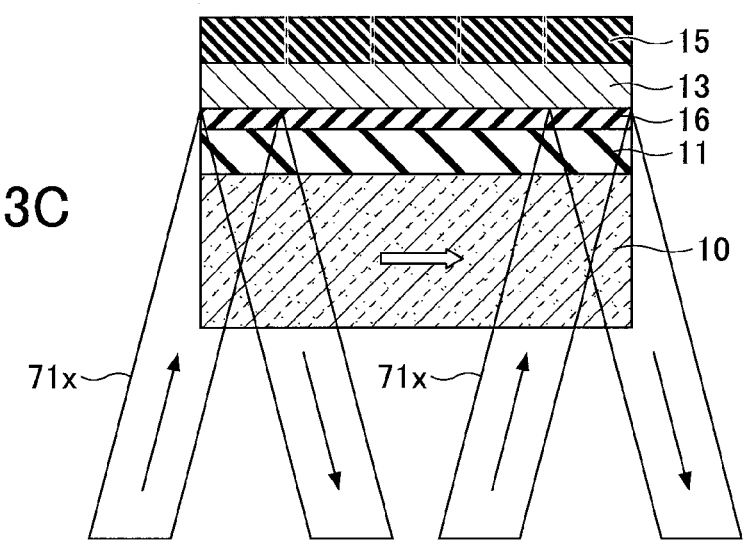

FIGS. 3A-3C are cross-sectional views illustrating the example of the heating method. In the process shown in FIG. 3A, a silicon substrate 10 having a thickness of approximately 500 μm is prepared. The silicon substrate 10 is used as a support substrate. Then, by a known method, a silicon oxide film ($SiO_2$ film) 11 having a film thickness of approximately 600 nm, a titanium oxide film (TiOx film) 16 having a film thickness of approximately 50 nm, and a platinum film 13 having a film thickness of approximately 100 nm are sequentially laminated on one surface of the silicon substrate 10. Here, the silicon substrate 10 is doped in advance with a foreign material of boron (B) of approximately $10 \times 10^{16}/cm^3$.

Subsequently, in the process of FIG. 3B, the amorphous PZT film 14 is laminated onto the platinum film 13, for example, by using the sputtering method or the Chemical Solution Deposition (CSD) method. The film thickness of the amorphous PZT film 14 may be approximately 60 nm, for example.

Subsequently, in the process shown in FIG. 3C, for example, a continuous-wave laser beam 71x (which has the wavelength of approximately 10.6 μm, for example) is locally irradiated onto a region in the left end of the structure shown in FIG. 3B from the other surface of the silicon substrate 10 (i.e., the surface of the silicon substrate 10 on which the silicon oxide film 11 is not formed). The energy density of the laser beam 71x may be approximately $1 \times 10^2$ $W/cm^2$ to $1 \times 10^6$ $W/cm^2$, for example. Irradiation time of the laser beam 71x may be from 1 ms to 200 ms, for example.

The silicon substrate 10, the silicon oxide film 11, and the titanium oxide film 16 are transparent with respect to light having a wavelength of approximately 10.6 μm. Accordingly, 90% or more of the light energy of the laser beam 71x that enters the silicon substrate 10 is absorbed by a light absorption layer formed of the platinum film 13. Here, the titanium oxide film 16 is an insulator film. The titanium oxide film 16 is not a light absorption layer.

The light energy of the laser beam 71x absorbed by the light absorption layer formed of the platinum film 13 is converted into heat, and the amorphous PZT film 14 formed on the platinum film 13 is locally heated from the side of the platinum film 13. The film properties of the heated portion of the amorphous PZT film 14 are converted (i.e., crystallized), and thereby crystalline PZT 15 is formed.

Further, the laser beam 71x is irradiated onto an object to be irradiated, while moving the position of the laser beam 71x relative to the position of the structure (i.e., the object to be irradiated) shown in FIG. 3B. For example, the amorphous PZT film 14 is crystallized in an order of from a front region in the left side of the structure shown in FIG. 3B toward the depth direction in FIG. 3B (i.e., the direction perpendicular to the paper surface of FIG. 3B). By doing this, a portion of the amorphous PZT film 14 in the left most region (which corresponds to the left most region of the crystalline PZT 15 separated by the dashed line in FIG. 3C) is crystallized. Subsequently, the same operation is sequentially performed for the regions in the right side. In this manner, the amorphous PZT film 14 is sequentially crystallized, and the whole surface of the amorphous PZT film 14 is eventually crystallized. Consequently, the crystalline PZT 15 is formed over the entire surface on the platinum film 13.

Additionally, a plurality of films of the crystalline PZT 15 can be laminated by further repeating the processes shown in FIGS. 3B and 3C, after forming the crystalline PZT 15 over the entire surface on the platinum film 13. Here, each of the films of the crystalline PZT 15 may have the film thickness of approximately 60 nm. For example, a thick film of the crystalline PZT 15 having a total thickness of approximately 2 μm can be formed by repeating the processes of FIGS. 3B and 3C thirty times.

As described above, in the heating method according to this example, the amorphous PZT film 14 is formed on the one surface of the platinum film 13. Here, the platinum film 13 is the light absorption layer, and the amorphous PZT film 14 is the layer to be heated. Subsequently, the laser beam 71x is irradiated onto a predetermined region of the platinum film 13 (which is the light absorption layer) from the other surface of the platinum film 13 (which is the light absorption layer), and the position of the laser beam 71x is moved relative to the object to be irradiated. In this manner, the whole surface of the amorphous PZT film 14 that is formed on the light absorption layer is crystallized, and thereby the crystalline PZT 15 is formed over the entire surface on the light absorption layer.

The heating method according to this example may be advantageous in the following point, in addition to the advantages of the heating method according to the previously described examples. Namely, by moving the position of the laser beam relative to the position of the object to be irradiated, the laser beam can be irradiated onto the whole surface of the amorphous film, and the whole surface of the amorphous film can be converted into a crystalline film having uniform crystallinity.

In the above explanation, the continuous-wave laser beam 71x is irradiated onto the silicon substrate 11 and the like. However, the embodiment is not limited to this, and a pulsed-wave laser beam may be irradiated, instead of the continuous-wave laser beam 71x. The wavelength of the laser beam 71x is not limited to 10.6 μm. The laser beam 71x having a wavelength other than 10.6 μm may be utilized, provided that the wavelength is greater than or equal to 1200 nm.

In the above explanation, the amorphous film 14 is laminated onto the platinum film 13. However, as described above, a metal film including any one metal of Ir, Pd, Rh, W, Fe, Ni, Ta, Cr, Zr, Ti, and Au may be utilized as the light absorption layer, instead of the platinum film 13. Alternatively, as the light absorption layer, a metal alloy film may be utilized that includes an alloy of at least one metal of the above-described metals. Alternatively, as the light absorption layer, a laminated film may be utilized that is formed by suitably selecting the metal film or the metal alloy film, and laminating a plurality of the selected films. In the above explanation, the amorphous PZT film 14 is used. However, a film formed of a material other than "PZT" may be utilized, such as a film formed of $BaTiO_3$ or Si.

Hereinafter, another example of the heating method is explained. In this example of the heating method, an amorphous PZT film whose surface has a predetermined shape (i.e., the amorphous PZT film has thickness distribution) is crystallized.

Figure 4A:
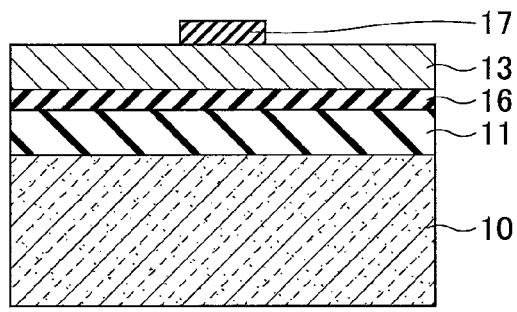
FIGS. 4A-4C are cross-sectional views illustrating another example of the method of heating according to the embodiment.
Figure 4B:
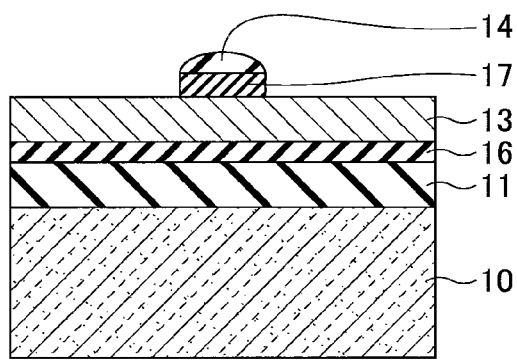
Figure 4C:
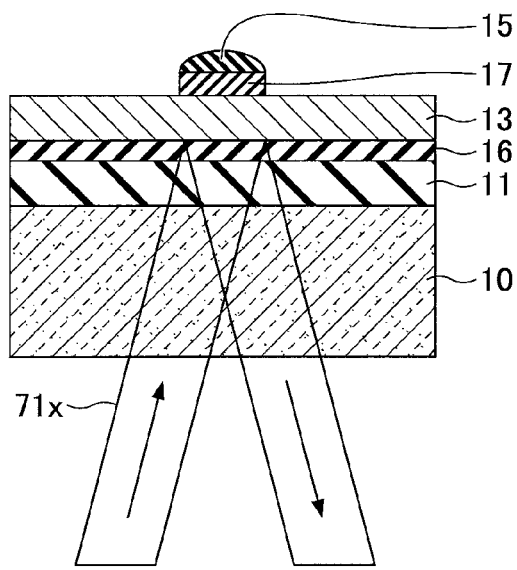

FIGS. 4A-4C are cross-sectional views illustrating the example of the heating method. In the process shown in FIG.

4A, a silicon substrate 10 having a thickness of approximately 500 μm is prepared. The silicon substrate 10 is used as a support substrate. Then, by a known method, a silicon oxide film (SiO$_2$ film) 11 having a film thickness of approximately 600 nm, a titanium oxide film (TiOx film) 16 having a film thickness of approximately 50 nm, and a platinum film 13 having a film thickness of approximately 100 nm are sequentially laminated on one surface of the silicon substrate 10. Further, a patterned SrRuO$_3$ film 17 is formed on the platinum film 13. Here, the silicon substrate 10 is doped in advance with a foreign material of boron (B) of approximately 10×10$^{16}$/cm$^3$.

Subsequently, in the process shown in FIG. 4B, a PZT precursor solution (which is a sol-gel solution) is applied onto the patterned SrRuO$_3$ film 17 by using an inkjet method (inkjet printing) or the like. The PZT precursor solution is heated, and an amorphous PZT film 14 is formed. The surface of the amorphous PZT film 14 has a predetermined shape. The cross-sectional shape of the surface of the amorphous PZT film 14 may be a convex curved shape such that the center portion protrudes upward, for example. The film thickness of the amorphous PZT film 14 (i.e., the film thickness of the thickest portion of the amorphous PZT film 14) may be approximately 60 nm, for example.

Subsequently, in the process shown in FIG. 4C, for example, a continuous-wave laser beam 71x (which has the wavelength of approximately 1300 nm, for example) is locally irradiated onto the structure shown in FIG. 4B from the other surface of the silicon substrate 10 (i.e., the surface of the silicon substrate 10 on which the silicon oxide film 11 is not formed). Here, the laser beam 71x may be irradiated onto a portion of the other surface of the silicon substrate 10 that corresponds to the position of the patterned SrRuO$_3$ film 17. The energy density of the laser beam 71x may be approximately 1×10$^2$ W/cm$^2$ to 1×10$^6$ W/cm$^2$, for example. Irradiation time of the laser beam 71x may be from 1 ms to 200 ms, for example.

The silicon substrate 10, the silicon oxide film 11, and the titanium oxide film 16 are transparent with respect to light having a wavelength of approximately 1300 nm. Accordingly, 90% or more of the light energy of the laser beam 71x that enters the silicon substrate 10 is absorbed by a light absorption layer formed of the platinum film 13. Here, the titanium oxide film 16 is an insulator film. The titanium oxide film 16 is not a light absorption layer.

The light energy of the laser beam 71x absorbed by the light absorption layer formed of the platinum film 13 is converted into heat, and the SrRuO$_3$ film 17 and the amorphous PZT film 14 formed on the platinum film 13 are heated from the side of the platinum film 13. The film properties of the heated portion of the amorphous PZT film 14 are converted (i.e., crystallized), and thereby crystalline PZT 15 is formed.

As described above, in the heating method according to this example, the patterned SrRuO$_3$ film 17 and the amorphous PZT film 14 are formed in the predetermined region on the one surface of the light absorption layer. Here, the surface of the amorphous PZT film 14 has the predetermined shape. Subsequently, the laser beam 71x is irradiated onto the portion on the other surface of the light absorption layer that corresponds to the position of the SrRuO$_3$ film 17, and the amorphous PZT film 17 is crystallized. Here, the amorphous PZT film 17 is formed on the one surface of the light absorption layer through the SrRuO$_3$ film 17, and the surface of the amorphous PZT film 17 has the predetermined shape. In this manner, crystalline PZT 15 can be formed.

The heating method according to this example may be advantageous in the following point, in addition to the advantages of the heating method according to the previously described examples.

Suppose that a laser beam is irradiated onto an amorphous film from the one surface of the light absorption layer (i.e., from the surface of the light absorption layer on which the amorphous film is formed). Here, it is assumed that the surface of the amorphous film has the predetermined shape, and the amorphous film is formed on the one surface of the light absorption layer. Due to the predetermined shape of the surface of the amorphous film, the amorphous film includes a portion having a large thickness and a portion having a small thickness. The light absorption rate of the portion having the large thickness is different from that of the portion having the small thickness. Accordingly, when the laser beam is irradiated onto the amorphous film, temperature distribution is induced in the portion having the large thickness and the portion having the small thickness of the amorphous film (i.e., the temperature in the amorphous film is uneven). Consequently, the formed crystalline film may not have uniform crystallinity.

In this example, the amorphous film is formed on the one surface of the light absorption layer. When the laser beam is irradiated onto the light absorption layer from the other surface of the light absorption layer, the light absorption layer is heated by the laser beam, and the heat of the light absorption layer is conducted (diffuses) to the amorphous film. In this manner, the amorphous film is heated and crystallized.

In this case, almost all the laser beam is absorbed by the light absorption layer, and almost no laser beam passes through the light absorption layer and reaches the amorphous film. Accordingly, it may not be necessary to consider that the amorphous film includes the portion having the large film thickness and the portion having the small film thickness, and that the light absorption rate of the portion having the large film thickness is different from that of the portion having the small film thickness.

Namely, as in the case of this example, when the laser beam is irradiated onto the light absorption layer from the other surface of the light absorption layer, the amorphous film can be crystallized by the laser beam of fixed power, irrespective of the shape the film (i.e., unevenness of the film thickness) formed on the one surface of the light absorption layer. In other words, by the heating method according to this example, the energy of the laser beam to be irradiated can be easily controlled, without considering the shape of the film (i.e., unevenness of the film thickness) formed on the one surface of the light absorption layer. As a consequence, a crystalline film having uniform crystallinity can be formed.

In the above explanation, the continuous-wave laser beam 71x is irradiated onto the silicon substrate 11 and the like. However, the embodiment is not limited to this, and a pulsed-wave laser beam may be irradiated, instead of the continuous-wave laser beam 71x. The wavelength of the laser beam 71x is not limited to 1300 nm. The laser beam 71x having a wavelength other than 1300 nm may be utilized, provided that the wavelength is greater than or equal to 1200 nm.

In the above explanation, the amorphous film 14 is laminated onto the platinum film 13 through the SrRuO$_3$ film 17. However, as described above, a metal film including any one metal of Ir, Pd, Rh, W, Fe, Ni, Ta, Cr, Zr, Ti, and Au may be utilized as the light absorption layer, instead of the platinum film 13. Alternatively, as the light absorption layer, a metal alloy film may be utilized that includes an alloy of at least one metal of the above-described metals. Alternatively, as the light absorption layer, a laminated film may be utilized that is formed by suitably selecting the metal film or the metal alloy film, and laminating a plurality of the selected films. In the above explanation, the amorphous PZT film 14 is used. However, a film formed of a material other than "PZT" may be utilized, such as a film formed of $BaTiO_3$ or Si.

Hereinafter, an example of a method of producing a piezoelectric element is explained. In this example, the piezoelectric element is produced by using the heating method according to some of the above-described examples.

Figure 5A:
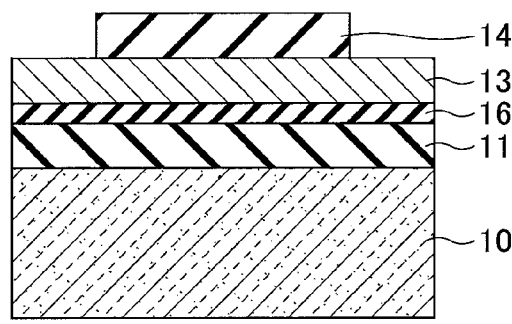
FIGS. 5A-5C are cross-sectional views illustrating a method of producing an example of a piezoelectric element according to the embodiment.
Figure 5B:
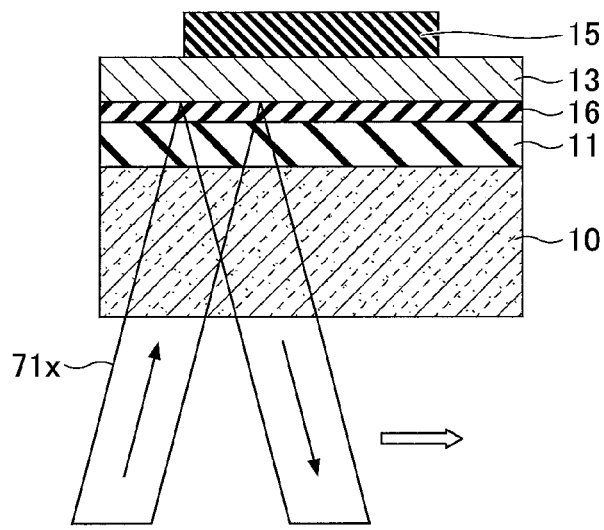
Figure 5C:
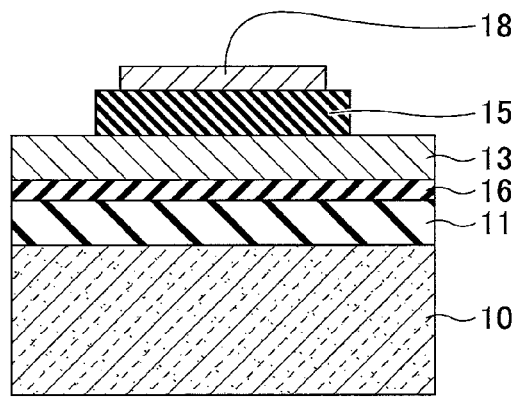

FIGS. 5A-5C are cross-sectional views illustrating the example of the method of producing the piezoelectric element. In the process shown in FIG. 5A, a silicon substrate 10 having a thickness of approximately 500 µm is prepared. The silicon substrate 10 is used as a support substrate. Then, by a known method, a silicon oxide film ($SiO_2$ film) 11 having a film thickness of approximately 600 nm, a titanium oxide film (TiOx film) 16 having a film thickness of approximately 50 nm, and a platinum film 13 having a film thickness of approximately 100 nm are sequentially laminated on one surface of the silicon substrate 10. Here, the silicon substrate 10 is doped in advance with a foreign material of boron (B) of approximately $10 \times 10^{16}/cm^3$.

Further, a patterned amorphous PZT film 14 is formed on the platinum film 13. A specific method of forming the patterned amorphous PZT film 14 is explained later in details. The film thickness of the amorphous PZT film 14 may be approximately 60 nm, for example.

Subsequently, in the process shown in FIG. 5B, for example, a continuous-wave laser beam 71x (which has the wavelength of approximately 1300 nm, for example) is locally irradiated onto the other surface of the silicon substrate 10 (i.e., the surface of the silicon substrate 10 on which the silicon oxide film 11 is not formed). Here, as shown in FIG. 5B, the laser beam 71x is irradiated onto a region in the left side of the other surface of the silicon substrate 10 that corresponds to the left end of the amorphous PZT film 14. The energy density of the laser beam 71x may be approximately $1 \times 10^2$ W/cm$^2$ to $1 \times 10^6$ W/cm$^2$, for example. Irradiation time of the laser beam 71x may be from 1 ms to 200 ms, for example.

The amorphous PZT film 14 is sequentially crystallized from the region in the left side in FIG. 5B by moving the position of the laser beam 71x relative to the position of the structure shown in FIG. 5B. Then, the whole surface of the amorphous PZT film 14 is eventually crystallized, and thereby crystalline PZT 15 is formed on a predetermined area on the platinum film 13.

After forming the crystalline PZT 15 on the predetermined area on the platinum film 13, a plurality of films of the crystalline PZT 15 are formed by repeating the processes of FIGS. 3B and 3C. Here, each of the films of the crystalline PZT 15 has a film thickness of approximately 60 nm. For example, a thick film of the crystalline PZT 15 having the total thickness of approximately 1 µm can be produced by repeating the processes of FIGS. 3B and 3C fifteen times.

In the process shown in FIG. 5C, the piezoelectric element is completed by forming a platinum film 18 having the film thickness of approximately 100 nm on a predetermined area on the crystalline PZT 15 by using the sputtering method, for example. In the piezoelectric element shown in FIG. 5C, the platinum film 13 functions as a lower electrode, the crystalline PZT 15 functions as a piezoelectric film, and the platinum film 18 functions as an upper electrode.

Namely, when a voltage is applied between the platinum film 13 that functions as the lower electrode and the platinum film 18 that functions as the upper electrode, the crystalline PZT 15, which is the piezoelectric film, is mechanically deformed.

As described above, in this example, the piezoelectric element is formed by locally heating the crystalline PZT 15 in the producing process. Accordingly, other members for which the heating process may not be required are not significantly heated. Consequently, deviation of dimensional precision may not be easily caused by thermal damage or thermal stress, and degradation of the performance of the piezoelectric element may be avoided.

Hereinafter, an example of a liquid droplet discharge head is explained. In the liquid droplet discharge head, a piezoelectric element is utilized. The piezoelectric element may be produced by the above-described example of the method of producing the piezoelectric element.

[Liquid Droplet Discharge Head]

Figure 6:
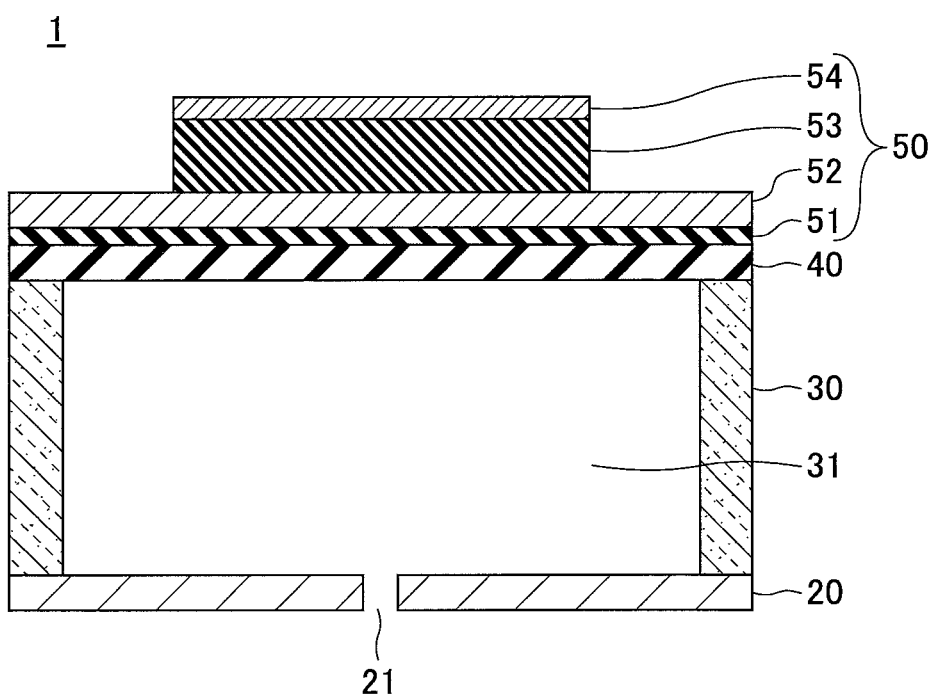
FIG. 6 is a cross-sectional view illustrating an example of a liquid droplet discharge head according to the embodiment.

FIG. 6 is a cross-sectional view exemplifying the liquid droplet discharge head according to this example. Referring to FIG. 6, the liquid droplet discharge head 1 includes a nozzle plate 20, a pressure chamber substrate 30, an oscillation plate 40, and a piezoelectric element 50. A nozzle 21 for discharging ink droplets is formed in the nozzle plate 20.

The nozzle plate 20 can be formed by Ni electroforming, for example. The nozzle plate 20, the pressure chamber substrate 30, and the oscillation plate 40 form a pressure chamber 31 (which may be referred to as an "ink flow channel," a "pressurizing liquid chamber," a "discharging chamber," or a "liquid chamber," for example) that communicates with the nozzle 21. The oscillation plate 40 forms a portion of the wall surface of the ink flow channel. In other words, the pressure chamber 31 is formed to communicate with the nozzle 21. The pressure chamber 31 is partitioned by the pressure chamber substrate 30 (which forms the side surfaces), the nozzle plate 20 (which forms the bottom surface), and the oscillation plate 40 (which forms the upper surface).

The pressure chamber 31 may be produced by processing a silicon single crystal substrate by using an etching method, for example. As the etching method, an anisotropic etching method may preferably be utilized. The anisotropic etching method is a method of etching that utilizes a property of the silicon single crystal such that an etching rate depends on plane orientation of a crystal structure. For example, in an anisotropic etching method in which a silicon single crystal substrate is dipped into an alkaline solution, such as a solution of KOH, an etching rate for a plane orientation of (100) may be approximately four hundred times as much as an etching rate for a plane orientation of (111). After processing the silicon single crystal substrate, the nozzle substrate 20 including the nozzle 21 is joined to the silicon single crystal substrate. In FIG. 6, depiction of a liquid supply unit, a flow channel, fluid resistance and the like are omitted.

The piezoelectric element 50 includes an adhesion layer 51, a lower electrode 52 (a lower electrode film), a piezoelectric film 53, and an upper electrode 54 (an upper electrode film). The piezoelectric element 50 has a function to press ink inside the pressure chamber 31. The adhesion layer 51 is a layer formed of, for example, Ti, $TiO_2$, TiN, Ta, $Ta_2O_5$, or $Ta_3N_5$. The adhesion layer 51 has a function to enhance adhesion between the lower electrode 52 and the oscillation plate 40. Here, the adhesion layer 51 may not be an essential element of the piezoelectric element 50.

In the piezoelectric element 50, when a voltage is applied between the lower electrode 52 and the upper electrode 54, the piezoelectric film 53 is mechanically deformed. As the piezoelectric element 50 is mechanically deformed, the oscillation plate 40 is deformed, for example, in the horizontal direction (d31 direction), and the oscillation plate 40 presses the ink inside the pressure chamber 31. In this manner, ink droplets are discharged from the nozzle 21.

Figure 7:
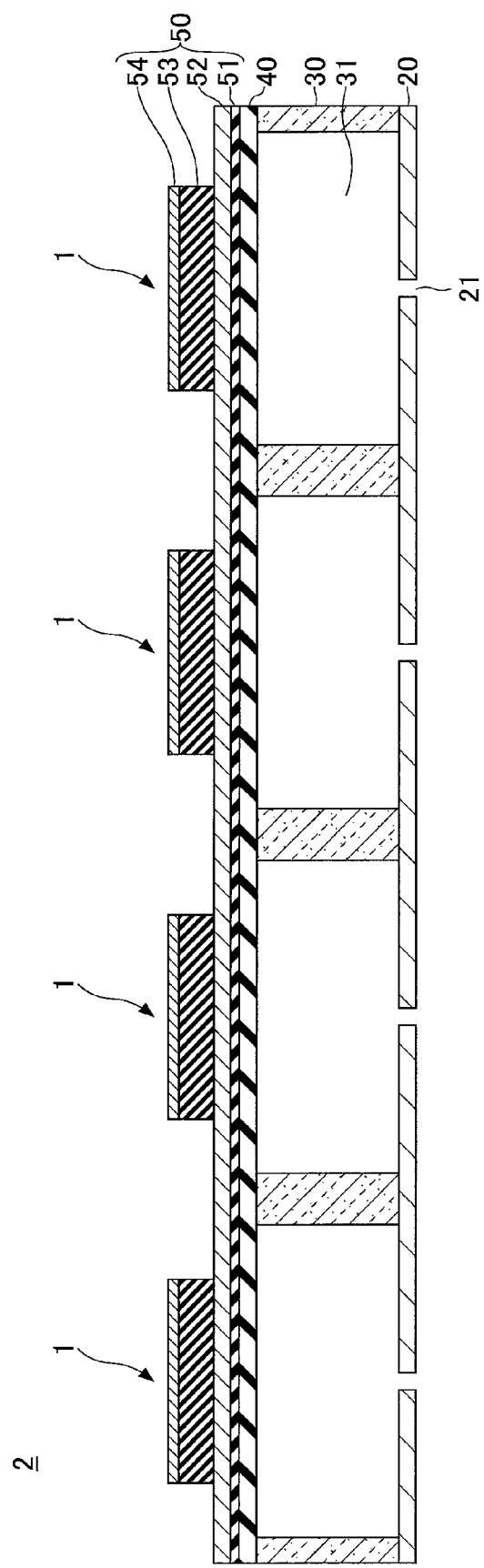
FIG. 7 is a cross-sectional view illustrating another example of the liquid droplet discharge head according to the embodiment.

As shown in FIG. 7, a liquid droplet discharge head 2 may be formed by arranging a plurality of the liquid discharge heads 1 in parallel.

As a material of the piezoelectric film 53, a perovskite-type crystal film of $ABO_3$ type may be utilized, for example. As the perovskite-type crystal film of $ABO_3$ type, for example, a complex oxide film including lead may be utilized, such as "PZT." Alternatively, as the perovskite-type crystal film of $ABO_3$ type, for example, a complex oxide film not including lead may be utilized, such as barium titanate. In this case, a mixture of a barium alkoxide and a titanium alkoxide compound may be utilized as a starting material, and a barium titanate precursor solution can be produced by dissolving the starting material in a common solvent.

These materials of the piezoelectric film 53 may be denoted by a general formula of $ABO_3$. These materials correspond to complex oxides including main components of A and B. Here, A is one or more elements of Pb, Ba, and Sr; and B is one or more elements of Ti, Zr, Sn, Ni, Zn, Mg, and Nb. Specifically, an example of such materials may be denoted as $(Pb_{1-x}, Ba_x)(Zr, Ti)O_3$, or $(Pb_{1-x}, Sr_x)(Zr, Ti)O_3$. The chemical formula $(Pb_{1-x}, Ba_x)(Zr, Ti)O_3$ corresponds to the case in which a portion of Pb in A-site is replaced with Ba. The chemical formula $(Pb_{1-x}, Sr_x)(Zr, Ti)O_3$ corresponds to the case in which a portion of Pb in A-site is replaced with Sr. Such substitution can be made, provided that the element with which Pb is replaced is a bivalent element. Such substitution may be effective for preventing degradation of the properties of the piezoelectric film 53 caused by evaporation of Pb during thermal processing.

As a material of the lower electrode 52, a metal having a high level of heat resisting property may be utilized that forms a self-assembled monolayer (SAM) film by a reaction with alkanethiol (which is described later). Specifically, as the material of the lower electrode 52, a metal film may be utilized that is formed of an element of a platinum group having a low level of reactivity, such as ruthenium (Ru), rhodium (Rh), palladium (Pd), osmium (Os), iridium (Ir), or platinum (Pt). Alternatively, as the material of the lower electrode 52, a metal film may be utilized that is formed of an alloy material or the like of an element of the platinum group.

Further, as the lower electrode 52, a film may be utilized that is formed by laminating a conductive oxide film after forming the above-described metal film. Specifically, as examples of the conductive oxide, $SrRuO_3$, $CaRuO_3$, and a solid solution of $SrRuO_3$ and $CaRuO_3$, i.e., $(Sr_{1-x}, Ca_x)O_3$, may be considered. These are complex oxides denoted by the chemical formula of $ABO_3$. These complex oxides include main components of A and B. Here, A is one or more elements of Sr, Ba, Ca, and La; and B is one or more elements of Ru, Co, and Ni. Additionally, as examples of the conductive oxide, $LaNiO_3$, $SrCoO_3$, and a solid solution of $LaNiO_3$ and $SrCoO_3$, i.e. $(La, Sr)(Ni_{1-y}, Co_y)O_3$ (including the case of y=1), may be considered. As another example of an oxide material, $IrO_2$ and $RuO_2$ may be considered.

The lower electrode 52 may be formed by a vacuum film formation method, such as the sputtering method or vacuum deposition. The lower electrode 52 is to be electrically connected to a source of an electric signal, as a common electrode for inputting the electric signal to the piezoelectric element 50. Accordingly, as a material of the oscillation film 40 that is disposed below the lower electrode 52, an insulator may be utilized. Alternatively, as the material of the oscillation film 40, a conductor may be utilized such that insulation processing is applied to the surface thereof.

Specifically, as a material of the oscillation plate 40, silicon may be utilized, for example. As a material that may be used for applying the insulation processing to the surface of the oscillation plate 40, for example, a silicon oxide film, a silicon nitride film, a silicon nitride oxide film, or a film formed by laminating these films may be utilized. Here, each of the silicon oxide film, the silicon nitride film, and the silicon nitride oxide film may have a thickness from approximately several hundred nm to several μm. Alternatively, taking into consideration the thermal expansion difference, a ceramic film may be utilized, such as an aluminum oxide film or a zirconia film. A silicon-based insulating film that may be used for applying the insulation processing to the surface of the oscillation plate 40 may be formed by a chemical vapor deposition (CVD) method or thermal oxidation processing of silicon, for example. Additionally, a metal oxide film (e.g., the aluminum oxide film) that may be used for applying the insulation processing to the surface of the oscillation plate 40 may be formed by the sputtering method, for example.

[Thin Film Manufacturing Apparatus]

Figure 8:
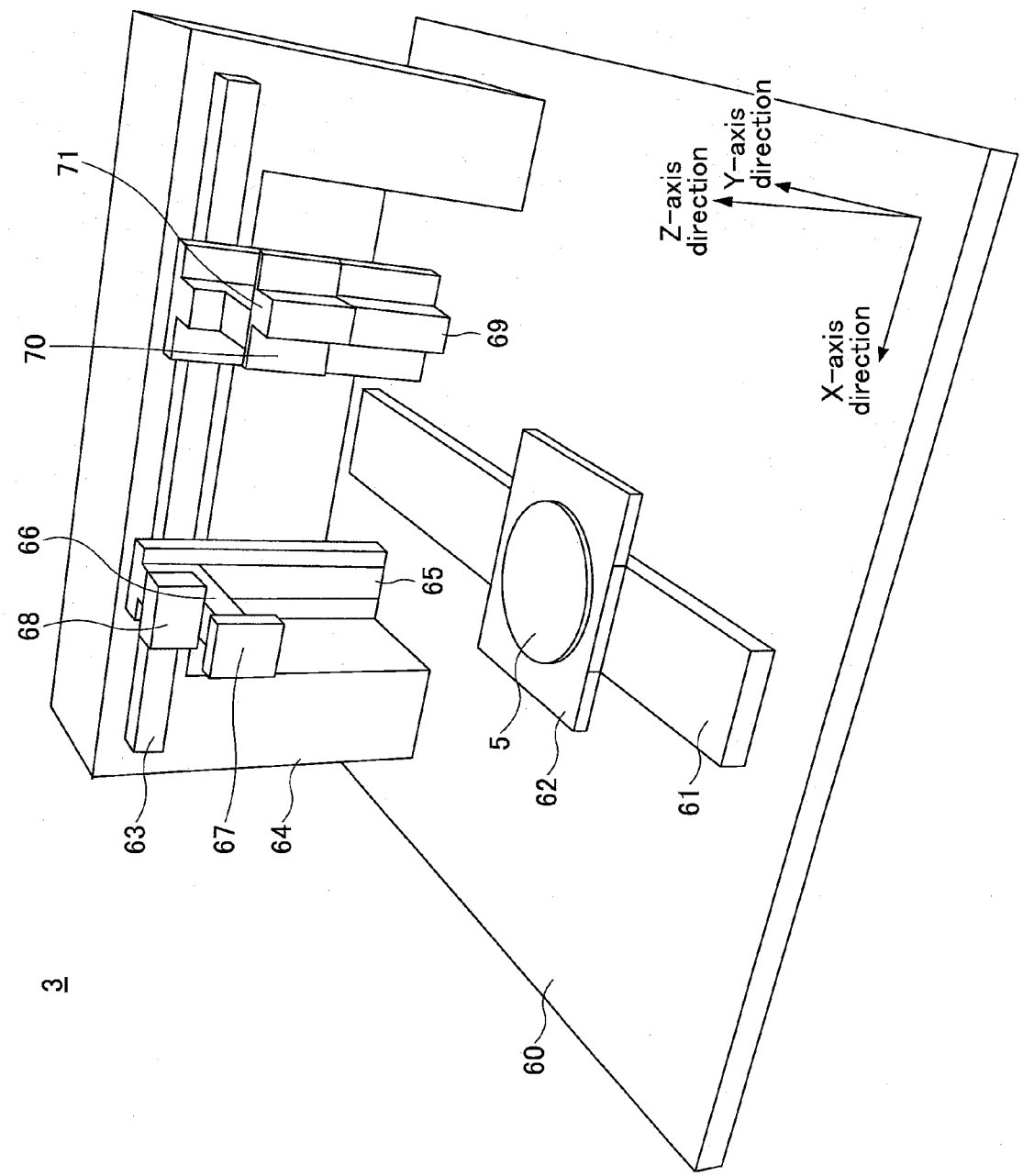
FIG. 8 is a perspective view exemplifying an example of a thin film manufacturing apparatus according to the embodiment.

Hereinafter, a configuration of an example of a thin film manufacturing apparatus is explained. FIG. 8 is a perspective view exemplifying the example of the thin film manufacturing apparatus. Referring to FIG. 8, in the thin film manufacturing apparatus 3, a Y-axis drive unit 61 is disposed on a stand 60. A stage 62 for mounting a substrate 5 is disposed on the Y-axis drive unit 61. The stage 62 can be moved in the Y-axis direction on the Y-axis drive unit 61.

Usually, the stage 62 includes a suction unit (not shown) that utilizes vacuum, static electricity, or the like. The substrate 5 can be fixed to the stage 62 by the suction unit. Additionally, the stage 62 may include a drive unit (not shown) that rotates the stage 62 around the Z-axis. A relative inclination among an inkjet head 67, a laser device 71 (which are described later), and the substrate 5 may be corrected by the drive unit.

Additionally, an X-axis support member 64 for supporting an X-axis drive unit 63 is disposed on the stand 60. A Z-axis drive unit 65 is attached to the X-axis drive unit 63. A head base 66 is attached to the Z-axis drive unit 65. Accordingly, the head base 66 can be moved in the X-axis direction and in the Z-axis direction.

The Z-axis drive unit 65 can control a distance between the inkjet head 67 (described later) and the substrate 5. The inkjet head 67 is mounted on the head base 66. The inkjet head 67 discharges functional ink (e.g., a PZT precursor solution). The functional ink is supplied from an ink tank 68 to the inkjet head 67 through a pipe for supplying ink (not shown).

Another Z-axis drive unit is attached to the X-axis drive unit 63. A laser support member 70 is attached to the X-axis drive unit 69. The laser device 71 (a light irradiation device) is mounted on the laser support member 70. The laser device 71 includes a laser that is a light emitter. The laser (the light emitter) has a function to emit light onto a light absorption layer. Here, a layer to be heated is formed on one surface of the light absorption layer. The laser emits light onto the light absorption layer from the other surface of the light absorption layer (which is the surface of the light absorption layer opposite to the one surface of the light absorption layer). The laser device 71 may be a laser device for continuous irradiation. Alternatively, the laser device 71 may be a laser device for pulsed irradiation. The Z-axis drive unit 69 can control a distance between the laser device 71 and the substrate 5.

FIG. 8 shows a configuration such that the stage 62 has a one degree of freedom in the Y-axis direction, and the inkjet head 67 and the laser device 71 have a one degree of freedom in the X-axis direction. However, the configuration of the thin film manufacturing apparatus 3 is not limited to this. For example, the stage 62 may have a two degrees of freedom in the X-axis direction and Y-axis direction, and positions of the inkjet head 67 and the laser device 71 may be fixed. Alternatively, the stage 62 may have a one degree of freedom in the Y-axis direction, and the inkjet head 67 and the laser device 71 may be arranged in a line in the Y-axis direction.

Alternatively, the position of the substrate 5 may be fixed, and the inkjet head 67 and the laser device 71 may have a two degrees of freedom in the X-axis direction and Y-axis direction. Here, it suffices if the X-axis and the Y-axis can span a single surface by an X-axis vector and a Y-axis vector. Accordingly, the X-axis may not be perpendicular to the Y-axis. For example, an angle between the X-axis vector and the Y-axis vector may be 30 degrees, 45 degrees, or 60 degrees.

The thin film manufacturing apparatus 3 includes a device control unit (not shown). The device control unit can control a condition for discharging the functional ink of the inkjet head 67 and a condition for irradiating a laser beam of the laser device 71. Additionally, the device control unit includes a storage unit (not shown). The device control unit can store information of a crystal state of the functional ink and/or information of the optimum condition for irradiating a laser beam in the storage unit.

[Method of Producing a Piezoelectric Film]

Hereinafter, an example of a method of producing a piezoelectric film is explained.

[Patterning of SAM Film]

As shown in FIGS. 9A-9D, a self assembled monolayer (SAM) film 58 having a predetermined pattern 58 is formed on the surface of the lower electrode 52. Specifically, in the process shown in FIG. 9A, the lower electrode 52 is prepared. For example, a platinum film may be used as the lower electrode 52. In the following explanation, it is assumed that the lower electrode 52 is formed of a platinum film.

Subsequently, in the process shown in FIG. 9B, the lower electrode 52 is dipped into self assembled monolayer (SAM) materials. The SAM materials may be formed of alkanethiol and the like. By doing this, one surface of the lower electrode 52 reacts with the SAM materials, and the SAM film 58 adheres on the one surface of the lower electrode 52. In this manner, the one surface of the lower electrode 52 can be hydrophobized. Reactivity and hydrophobicity (a water repellent property) of alkanethiol depend on a molecular chain length. Usually, alkanethiol can be produced by dissolving a molecule having a carbon number of from 6 to 18 in an organic solvent, such as alcohol, acetone, or toluene. The concentration of alkanethiol may be several mol/l. After a predetermined time period has elapsed, the lower electrode 52 is removed. The lower electrode 52 is displacement washed with a solvent, and excessive molecules are removed. Then, the lower electrode 52 is dried.

Figure 9A:
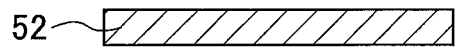
FIGS. 9A-9D are diagrams exemplifying an example of a method of producing a piezoelectric film according to the embodiment.
Figure 9B:
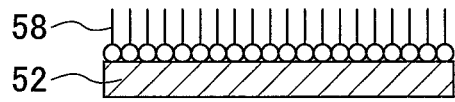
Figure 9C:
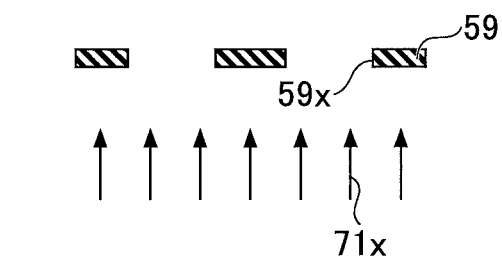

In the process shown in FIG. 9C, a continuous-wave laser beam 71x (whose wavelength is approximately 980 nm, for example) is irradiated onto the lower electrode 52 from the other surface of the lower electrode 52 through a mask 59 having an opening 59x.

As previously explained, the platinum film absorbs almost all the light energy of the laser beam 71x having the wavelength of approximately 980 nm. Accordingly, when the laser beam 71x having the wavelength of approximately 980 nm is irradiated onto a portion of the lower electrode 52 within the opening 59x, since the lower electrode 52 is formed of the platinum film, almost all the light energy of the laser beam 71x is absorbed by the portion of the lower electrode 52. Thus, the portion of the lower electrode 52 (which is formed of the platinum film) within the opening 59x is locally heated.

The light energy of the laser beam 71x absorbed by the lower electrode 52 is converted into heat. Thus, a portion of the SAM film 58 within the opening 59x, which is formed on the other surface of the lower electrode 52, is heated. The heated portion of the SAM film 58 (within the opening 59x) disappears. In this manner, as shown in FIG. 9D, the SAM film 58 having the predetermined pattern is formed on the one surface of the lower electrode 52.

Here, the laser beam 71x may be irradiated from the other surface of the lower electrode 52 (i.e., the side to which the SAM film 58 is not adhered) by using a laser device that can emit the laser beam 71x. Alternatively, the SAM film may be adhered to the entire surface of the one surface of the lower electrode 52, and the lower electrode 52 may be mounted on the stage 62 of the thin film manufacturing apparatus 3 shown in FIG. 8, so that the SAM film 58 faces the stage 62. Then, the laser device 71 may emit the laser beam 71 onto the lower electrode 52. The laser beam 71x may be irradiated from the other surface of the lower electrode (i.e., the surface to which the SAM film 58 is not adhered).

When the SAM film 58 is formed on the lower electrode 52 that is formed on one surface of a silicon substrate, the laser beam 71x having the wavelength of approximately 1400 nm may be irradiated from the other surface of the silicon substrate. The laser beam 71x having the wavelength of approximately 1400 nm can pass through the silicon substrate.

Figure 9D:
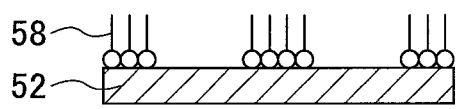

In the process shown in FIG. 9D, some area on the surface of the lower electrode 52 becomes hydrophobic, and the other area of the surface of the lower electrode 52 becomes hydrophilic. Specifically, the area where the SAM film 58 is formed becomes hydrophobic. The area where the SAM film 58 is removed and the surface of the lower electrode 52 is exposed becomes hydrophilic. As described in details below, by using contrast of the surface energy, the PZT precursor solution can be selectively applied to the lower electrode 52. Here, the SAM film 58 having the predetermined pattern may be formed by using a known method in which no laser beam is utilized (e.g., a method in which the photolithography method, the dry etching method, and the like are combined).

[Formation of the Piezoelectric Film]

Next, as shown in FIGS. 10A-10C, the piezoelectric film 53 is formed on the lower electrode 52. Specifically, in the process shown in FIG. 10A, the lower electrode 52 (which corresponds to the substrate 5 in FIG. 8) is mounted on the stage 62 of the thin film manufacturing apparatus 3. Here, the SAM film 58 having the predetermined pattern is formed on the surface of the lower electrode 52. Then, the position and/or the inclination of the lower electrode 52 is aligned by using a known alignment apparatus (e.g., a CCD camera or a CMOS camera), for example.

The inkjet head 67 is placed above the stage 62 by moving the inkjet head 67 in the X-axis direction, and moving the stage 62, on which the lower electrode 52 is mounted, in the Y-axis direction. Then, the inkjet head 67 discharges the functional ink 53a onto an area of the surface of the lower electrode 52 where the SAM film 58 is removed (i.e., the hydrophilic area). At this time, by the contrast of the surface energy, the functional ink 53a spreads only over the area where the SAM film 58 is removed (i.e., the hydrophilic area).

In this manner, by using the contrast of the surface energy, a layer of the functional ink 53a is formed only on the area where the SAM film 58 is removed (i.e., the hydrophilic area). With this, a consumption amount of the liquid to be applied can be reduced, compared to that of another process, such as the process of the spin coating method. At the same time, the process can be simplified. As the functional ink 53a, the PZT precursor solution can be utilized, for example. The functional ink 53a may be in an amorphous state.

In the process (the drying process) shown in FIG. 10B, the lower electrode 52 is disposed on a hot plate (not shown), and the lower electrode 52 is heated to be a temperature from approximately 100° C. to 300° C., for example. Here, the layer of the functional ink 53a and the SAM film 58 are formed on the one surface of the lower electrode 52. By doing this, the solvent evaporates, and the functional ink 53a becomes thermally decomposed functional ink 53b. The functional ink 53b is in an amorphous state. Here, the thermally decomposed functional ink 53b is in a solid state. Accordingly, even if the lower electrode 52 is arranged such that the functional ink 53b faces downward, the functional ink 53b may not be deformed.

In the process shown in FIG. 10C, the lower electrode 52 (which corresponds to the substrate 5 in FIG. 8) is disposed on the stage 62 of the thin film manufacturing apparatus 3. Here, the layer of the functional ink 53b and the SAM film 58 are formed on the one surface of the lower electrode 52, and the lower electrode 52 is disposed on the stage 62 such that the layer of the functional ink 53b and the SAM film 58 face the stage 62. Then, the position and/or the inclination of the lower electrode 52 is aligned by using a known alignment apparatus (e.g., a CCD camera or a CMOS camera), for example.

Then, the laser device 71 emits the laser beam 71x onto the upper side of the lower electrode (i.e., the other surface of the lower electrode on which the layer of the functional ink 53b and the SAM film 58 are not formed). Alternatively, the layer of the functional ink 53b and the SAM film 58 may be formed on one surface of the lower electrode 52, and the lower electrode 52 may be arranged such that the layer of the functional ink 53b and the SAM film 58 face upward. Then, the laser beam 71x may be irradiated from the lower side (i.e., the other surface) of the lower electrode 52 by using a predetermined laser device. Alternatively, the layer of the functional ink 53b and the SAM film 58 may be formed on one surface the lower electrode 52, and the lower electrode 52 may be tilted such that the layer of the functional ink 53b and the SAM film 58 are inclined with respect to the horizontal direction by a predetermined angle (e.g. 90 degrees). Then, the laser beam 71x may be irradiated from the other surface of the lower electrode 52 by using a predetermined laser device.

As the laser beam 71x, for example, a continuous-wave laser beam having a wavelength of approximately 980 nm may be utilized. Alternatively, as the laser beam 71x, a pulsed-wave laser beam may be utilized. The energy density of the laser beam 71x may be approximately $1 \times 10^2$ W/cm$^2$ to $1 \times 10^6$ W/cm$^2$, for example. Irradiation time of the laser beam 71x may be from 1 ms to 200 ms, for example.

As previously explained, the platinum film absorbs almost all the light energy of the laser beam 71x having the wavelength of approximately 980 nm. Accordingly, when the laser beam 71x having the wavelength of approximately 980 nm is irradiated onto the lower electrode 52, since the lower electrode 52 is formed of the platinum film, almost all the light energy of the laser beam 71x is absorbed by the lower electrode 52. Thus, the lower electrode 52 (which is formed of the platinum film) is locally heated.

The light energy of the laser beam 71x absorbed by the lower electrode 52 is converted into heat. Thus, the layer of the functional ink 53b (e.g., amorphous PZT) formed on the lower electrode 52 is locally heated from the side of the lower electrode 52. The film properties of the heated portion of the layer of the functional ink 53b are converted (crystallized), and the heated portion of the layer of the functional ink 53b becomes a layer of functional ink 53c. The layer of the functional ink 53c may be formed of crystalline PZT.

After that, the position of the laser device 71 relative to the position of the lower electrode 52 (which is the object to be irradiated) is adjusted by moving the stage 62 to a predetermined position. The laser beam 71x is irradiated onto the lower electrode 52 again, and the whole layer of the functional ink 53b (e.g., amorphous PZT) is converted into the functional ink 53c (e.g., the crystalline PZT). Here, in the process shown in FIG. 10C, the SAM film 58 disappears.

When the layer of the functional ink 53b is formed on the lower electrode 52 that is formed on one surface of a silicon substrate, the laser beam 71x having the wavelength of approximately 1400 nm may be irradiated from the other surface of the silicon substrate. The laser beam 71x having the wavelength of approximately 1400 nm can pass through the silicon substrate.

The film of the functional ink 53c (e.g., a PZT thin film) is crystallized in the process shown in FIG. 10C. The film thickness may be approximately several tens of nm. However, this film thickness may be insufficient. Accordingly, after the process shown in FIG. 10C, the processes from FIG. 9B to FIG. 10C may be repeated a necessary number of times. In this manner, a plurality of layers of the functional ink 53c (e.g., crystalline PZT films) is laminated, and thereby a crystallized functional ink film having a suitable pattern and thickness (e.g., approximately several μm) can be formed on the lower electrode 52. Namely, the piezoelectric film 53 can be produced.

Hereinafter, a comparative example is explained by referring to FIG. 11. In the comparative example, the layer of the functional ink 53b and the SAM film 58 are formed on one surface of the lower electrode 52, and a laser beam is irradiated from the one surface of the lower electrode 52, namely, from the surface of the lower electrode 52 on which the layer of the functional ink 53a and the SAM film 58 are formed.

In the process shown in FIG. 11A, the lower electrode 52 such as shown in FIG. 10B is prepared. Here, the layer of the functional ink 53b and the SAM film 58 is formed on the one surface of the lower electrode 52. Then, the laser beam 71x is irradiated onto the lower electrode 52 from the surface of the layer of the functional ink 53b and the SAM film 58 by using the laser device 71. In this manner, the layer of the functional ink 53b (e.g., an amorphous PZT film) is converted into the layer of the functional ink 53c (e.g., a crystalline PZT film).

In the process shown in FIG. 11B, the processes from FIG. 9B to FIG. 10B are repeated again, after the process shown in FIG. 11A. Here, the laser beam 71x is irradiated onto the lower electrode 52 from the side of the layer of the functional ink 53b and the SAM film 58 by using the laser device 71. By doing this, the layer of the functional ink 53b (e.g., an amorphous PZT film) is converted into the layer of the functional ink 53c (e.g. a crystalline PZT film). In this process, two layers of the functional ink 53c are formed.

In the process shown in FIG. 11B, the layers of the functional ink 53 are laminated and the film thickness is increased. Accordingly, a light absorption rate of the layer of the functional ink 53c changes. When the light absorption rate is changed, even if the laser beam of the same power is irradiated onto the layer of the functional ink 53c, the temperature of the layer of the functional ink 53c after heating may be different. Accordingly, in order to heat the layer of the functional ink 53c to be a constant temperature both in the process shown in FIG. 11A and the process shown in FIG. 11B, the power of the laser beam to be irradiated onto the layer of the functional ink 53c may be adjusted depending on the number of the laminated layers of the functional ink 53c. Namely, the power of the laser beam irradiated onto the film of the functional ink 53c may be adjusted depending on the film thickness of the layer of the functional ink 53c.

A relationship between the film thickness and the light absorption rate may be obtained in advance by measurement. The power of the laser beam may be adjusted, for example, based on the relationship. However, when the power of the laser beam irradiated onto the layer of the functional ink 53c is adjusted depending on the number of the laminated layers of the functional ink 53c, the manufacturing process may be extremely complicated. Such a case may not be preferable because manufacturing cost of the Piezoelectric element and the liquid droplet discharge head may be increased.

According to the embodiment of the present invention, the layer of the functional ink 53b (e.g., an amorphous PZT film) is crystallized by irradiating the laser beam onto the lower electrode 52 from the surface of the lower electrode 52 on which the layer of the ink 53b and the SAM film 58 are not formed. In this case, the laser beam heats the lower electrode 52 that is the light absorption layer. The heat of the light absorption layer is conducted to the layer of the functional ink 53b that is an amorphous film. In this manner, the layer of the functional ink 53b is heated and crystallized.

In this case, almost all the laser beam is absorbed by the lower electrode 52 that is the light absorption layer, and almost no laser beam passes through the light absorption layer and reaches the layer of the functional ink 53b that is the amorphous film. Accordingly, even if a plurality of crystalline films and amorphous films are laminated and the total thickness is varied, it may not be necessary to consider the effect of the change in the light absorption rate.

Namely, when an amorphous film is formed on one surface of a light absorption layer, and when a laser beam is irradiated onto the light absorption layer from the other surface of the light absorption layer, the amorphous film can be crystallized by irradiating the laser beam of fixed power, regardless of the thickness of the amorphous film formed on the one surface of the light absorption layer. In other words, with the heating method according to the embodiment, the power of the laser beam to be irradiated can be easily controlled, without considering the thickness of the film that is formed on the one surface of the light absorption layer. As a consequence, a crystalline film having uniform crystallinity can be formed.

Additionally, FIG. 11C shows that a foreign material 500 is adhered on the layer of the functional ink 53b. When the foreign material 500 is adhered on the layer of the functional ink 53b, the light absorption rate varies in the vicinity of the foreign material 500. Thus, the layer of the functional ink 53b may not be uniformly heated. As a consequence, a crystalline film having uniform crystallinity may not be formed. Thus, a yield rate of the piezoelectric element may be decreased.

In the heating method according to the embodiment, the layer of the functional ink 53b (e.g., an amorphous PZT film) is crystallized by irradiating the laser beam onto the lower electrode 52 from the surface of the lower electrode 52 on which the layer of the ink 53b and the SAM film 58 are not formed. Namely, the layer to be heated is heated by diffusion of heat from the light absorption layer. Thus, it may not be necessary to consider the change in the light absorption rate. Even if a foreign material is adhered to the layer to be heated, the layer to be heated can be successfully heated.

Additionally, even if a foreign material is adhered to the surface of the light absorption layer onto which the laser beam is irradiated, the layer to be heated can be successfully heated. That is because, even if the foreign material is adhered to the surface of the light absorption layer onto which the laser beam is irradiated, the heat may not be prevented from diffusing from the light absorption layer to the layer to be heated.

In this example, by producing the piezoelectric element by using the heating method according to the embodiment, a liquid droplet discharge head including a piezoelectric film having uniform crystallinity can be obtained. In such a liquid droplet discharge head, ink discharge characteristics may be stabilized.

Figure 12:
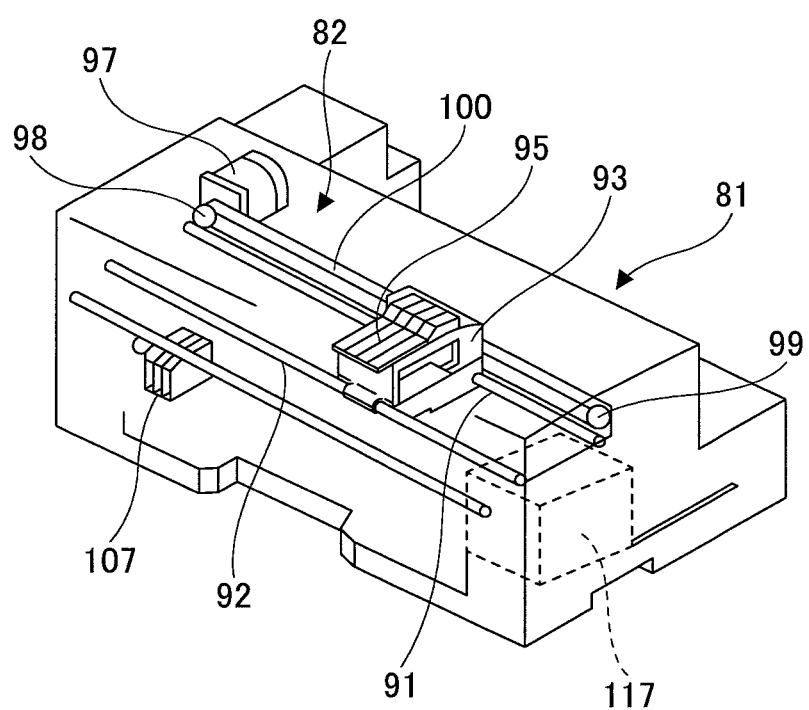
FIG. 12 is a perspective view exemplifying an example of an inkjet recording device according to the embodiment.
Figure 13:
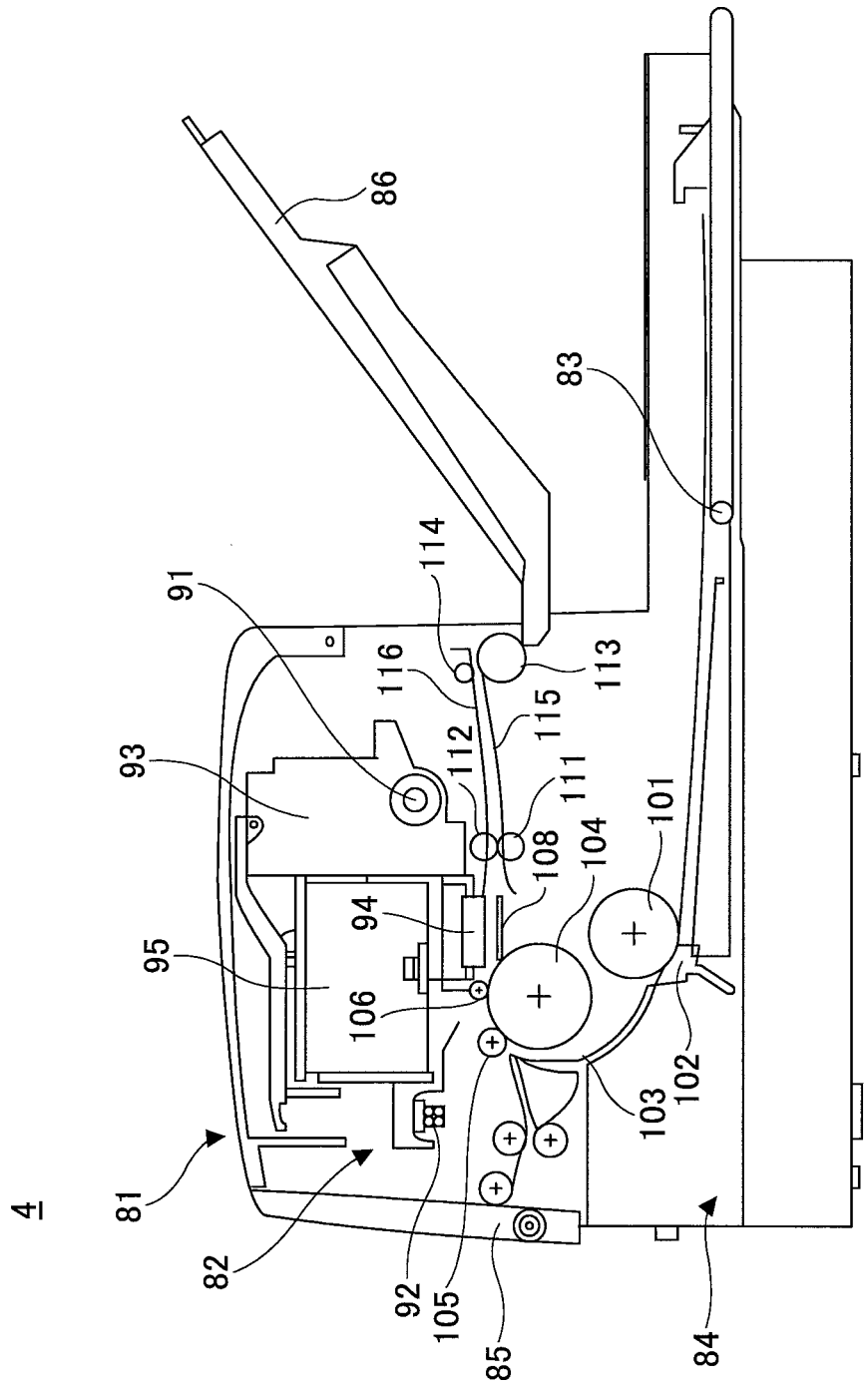
FIG. 13 is a side view exemplifying mechanical elements of the example of the inkjet recording device according to the embodiment.

Hereinafter, an example of an inkjet recording device is explained. The inkjet recording device is an example of a liquid droplet discharge device including the liquid droplet discharge head 2 (cf. FIG. 7) that is manufactured by the thin film manufacturing apparatus 3. FIG. 12 is a perspective view exemplifying the inkjet recording device. FIG. 13 is a side view exemplifying mechanical elements of the inkjet recording device.

Referring to FIGS. 12 and 13, a recording device main body 81 of the inkjet recording device 4 includes a carriage 93 that can be moved in a main scanning direction, and an inkjet recording head 94 that is mounted on the carriage 93. Here, the inkjet recording head 94 is an example of the liquid droplet discharge head 2. Additionally, the inkjet recording device 4 includes a printing unit 82. The printing unit 82 includes ink cartridges 95 for supplying ink to the inkjet recording head 94.

A paper feeding cassette 84 (or a paper feeding tray) can be detachably attached to a lower portion of the recording device main body 81. The paper feeding cassette 84 can store many paper sheets 83. Further, the recording device main body 81 includes a manual feed tray 85. The manual feed tray 85 is for manually feeding the paper sheets 83. The manual feed tray can be opened and closed. The inkjet recording device 4 takes in the paper sheet 83 that is fed from the paper feeding cassette 84 or the manual feed tray 85, and the printing unit 82 records a desired image on the paper sheet 83. Subsequently, the inkjet recording device 4 discharges the paper sheet 83 onto a paper discharge tray 86.

In the printing unit 82, the carriage 93 is supported by a main guide rod 91 and a sub guide rod 92, so that the carriage 93 can be slid in a main scanning direction. The main guide rod 91 and the sub guide rod 92 are horizontally supported by a left side plate and a right side plate (not shown). The inkjet recording head 94 is attached to the carriage 93, while a plurality of ink discharge ports (nozzles) are arranged in a direction which intersects the main scanning direction, and an ink droplet discharge direction is directed downward. The inkjet recording head 94 discharges yellow (Y) ink droplets, cyan (C) ink droplets, magenta (M) ink droplets, and black (Bk) ink droplets. Further, the carriage 93 includes ink cartridges 95 for supplying the corresponding colors of ink to the inkjet recording head 94.

Each of the ink cartridges 95 includes an air inlet (not shown) that communicates with an outside air; a supply port (not shown) for supplying the corresponding ink to the inkjet recording head 94; and a porous body (not shown) filled with the corresponding ink. Here, the air inlet is arranged at an upper portion of the ink cartridge 95, the supply port is arranged at a lower portion of the ink cartridge 95, and the porous body is disposed inside the ink cartridge 95. The pressure of the ink supplied to the inkjet recording head 94 is kept slightly negative by the capillary force of the porous body. Here, as the inkjet recording head 94, recording heads which correspond to yellow, cyan, magenta, and black are utilized. However, a single head including nozzles for discharging corresponding colors of ink may be utilized.

A downstream side in a paper sheet conveyance direction of the carriage 93 slidably fits to the main guide rod 91, and an upstream side in the paper sheet conveyance direction of the carriage 93 is slidably placed on the sub guide rod 92. In order that the carriage 93 can be moved and can scan in the main scanning, a timing belt 100 is wound around a drive pulley 98 that is rotationally driven by a main scanning motor 97 and a driven pulley 99, and the carriage 93 is reciprocated by the forward and reverse rotations of the main scanning motor 97. The timing belt 100 is fixed to the carriage 93.

Further, the inkjet recording apparatus 4 includes a paper feeding roller 101 and a friction pad 102 for feeding the paper sheets 83 from the paper feeding cassette 84 and for separating the paper sheets 83; a guide member 103 for guiding the paper sheet 83; a conveyance roller 104 that inverts the paper sheet 83 being fed and conveys the paper sheet 83. Furthermore, the inkjet recording device 4 includes a pressing roller 105 that is pressed to a peripheral surface of the conveyance roller 104; and a top end roller 106 that defines an angle of sending the paper sheet 83 from the conveyance roller 104. With such a configuration, the paper sheet 83 set in the paper feeding cassette 84 is conveyed to a lower side of the inkjet recording head 94. The conveyance roller 104 is rotationally driven by a sub-scanning motor 107 through a sequence of gears.

The inkjet recording device 4 further includes a print support member 108 that is a paper guide member. The print support member 108 guides the paper sheet 83 sent out from the conveyance roller 104 at the area below the inkjet recording head 94. The length of the print support member 108 corresponds to a moving range in the main scanning direction of the carriage 93. At a downstream side in the paper sheet conveyance direction of the printing support member 108, the inkjet recording device 4 further includes a conveyance roller 111 and a spur 112 that are rotationally driven so as to send the paper sheet 83 in a paper discharging direction. Furthermore, the inkjet recording device 4 includes a paper eject roller 113 and a spur 114 for sending the paper sheet 83 onto the paper discharge tray 86; and guide members 115 and 116 that form a paper ejection path.

When the inkjet recording device 4 records an image, the inkjet recording device 4 drives the inkjet recording head 94 in accordance with an image signal, while moving the carriage 93. In this manner, the inkjet recording head 94 discharges ink onto the paper sheet 83, which remains stationary, and thereby recording corresponding to one line is completed. Subsequently, the inkjet recording device 4 records the next line, after sending the paper sheet 83 by a predetermined distance. When the inkjet recording device 4 receives a recording termination signal or a signal indicating that the end of the paper sheet 83 reaches the recording area, the inkjet recording device 4 terminates the recording operation and ejects the paper sheet 83.

Further, the inkjet recording device 4 includes a recovering device 117 for recovering a discharge failure of the inkjet recording head 94. The recovering device 117 is disposed at a position outside the recording area. The position of the recovering device 117 is at a rightmost side in a direction in which the carriage 93 moves. The recovering device 117 includes a cap unit, a suction unit, and a cleaning unit. During the print waiting state, the carriage 93 is moved to the side of the recovering device 117, and the inkjet recording head 94 is capped by the cap unit. In this manner, the wet conditions of the discharging ports are maintained, and a discharge failure caused by ink drying is prevented. Additionally, during recording or the like, the inkjet recording device 4 causes the inkjet recording head 94 to discharge ink that is not related to the recording. In this manner, ink viscosity at all the discharge ports is kept constant, and a stable discharging performance is maintained.

When a discharge failure occurs, the inkjet recording device 4 causes the cap unit to seal the discharging ports of the inkjet recording head 94. Then, the suction unit suctions babbles along with the ink from the discharge ports through a tube. The cleaning unit removes the ink or dusts attached to a surface of the discharge ports. In this manner, the discharge failure is recovered. The suctioned ink is discharged to a waste ink reservoir (not shown) disposed at a lower portion of the recording device main body 81, and an ink absorber in the waste ink reservoir absorbs and reserves the suctioned ink.

As described above, the inkjet recording device 4 includes the inkjet recording head 94. The inkjet recording head 94 is an example of the droplet discharge head 2 that is manufactured by the thin film manufacturing device 3. Accordingly, ink droplet discharge failure may not be caused by failure of driving the oscillation plate. Thus, stable ink droplet discharge characteristics can be obtained, and image quality can be enhanced.

Hereinabove, the method of heating the film, the method of producing the piezoelectric film and the piezoelectric element, the liquid discharge head, the liquid droplet discharge device, and the light irradiation device are explained by the embodiment. However, the present invention is not limited to the above described embodiment, and various modifications and improvements may be made within the scope of the present invention.

The piezoelectric element according to the embodiment is utilized as a component of the liquid droplet discharge head that is used in the inkjet recording device or the like. However, the usage of the piezoelectric element is not limited to this. The piezoelectric element according to the embodiment may be used as a component of a micropump, an ultrasonic motor, an acceleration sensor, a dual axis scanner for a projector, or an infusion pump, for example.

The light irradiated onto the light absorption layer is not limited to the laser beam. Any type of light can be used, provided that the type of the light can heat the light absorption layer (i.e., the type of the light is absorbed by the light absorption layer). For example, a flashlamp may be used.

The present application is based on and claims the benefit of priority of Japanese Priority Application No. 2013-020389 filed on Feb. 5, 2013, the entire contents of which are hereby incorporated herein by reference.

What is claimed is:

1. A method of producing a crystallized film comprising:
forming an amorphous layer on a lower electrode film, wherein the lower electrode film is a light absorption layer formed on one surface of a support substrate that is made of silicon, the light absorption layer being a heat resistant film having a melting point of greater than or equal to 1000° C., and the light absorption layer being any one of a metal film including any one metal of Pt, Ir, Pd, Rh, W, Fe, Ni, Ta, Cr, Zr, Ti and Au; a metal alloy film including any one metal alloy of Pt, Ir, Pd, Rh, W, Fe, Ni, Ta, Cr, Zr, Ti and Au; and a laminated film that is formed by selecting the metal film or the metal alloy film, and by laminating a plurality of the selected films; and
heating the lower electrode film by irradiating a laser beam light that passes through the support substrate onto the lower electrode film from another surface of the support substrate with a temperature that can crystallize the amorphous layer to form a complex oxide film, the temperature being above a crystallization temperature of the amorphous layer and below a melting point of the light absorption layer,
wherein the another surface of the support substrate is a surface opposite to the one surface of the support substrate, and
the heating irradiates the laser beam of fixed power, irrespective of the thickness of the amorphous layer,
wherein the support substrate is formed on another surface of the light absorption layer, and
the method further including controlling a heating area of the lower electrode film to a limited area by focusing the laser beam light that is irradiated onto the another surface of the light absorption layer, and absorbing 90% or more of light energy of laser beam light that enters the support substrate by the light absorption layer.

2. The method according to claim 1,
wherein, in the process of heating, the amorphous layer is crystallized by conducting heat of the lower electrode film to the amorphous layer.

3. The method according to claim 2,
wherein the amorphous layer includes lead.

4. The method according to claim 2,
wherein the amorphous layer does not include lead.

5. The method according to claim 2,
wherein, in the process of heating, the amorphous layer in an amorphous state is converted into a perovskite-type crystal film of $ABO_3$-type.

6. The method according to claim 2,
wherein, in the process of heating, the crystallized amorphous layer is a perovskite-type crystal film of $ABO_3$-type, and a crystal grain is grown in the crystallized amorphous layer.

7. The method according to claim 2,
wherein, after the process of heating, an upper electrode film is formed on the amorphous layer.

8. The method according to claim 1,
wherein, the heating crystallize the amorphous layer by conducting heat of the light absorption layer to the amorphous layer.

9. The method according to claim 1,
wherein the laser beam light is locally irradiated onto the another surface of the support substrate.

10. The method according to claim 1,
wherein, the heating crystallizes the amorphous layer, while moving a position of the laser beam light onto the light absorption layer relative to a position of the light absorption layer.

11. The method according to claim 1, further comprising:
laminating another amorphous layer on the amorphous layer, wherein the amorphous layer includes a crystallized region; and
crystallizing the another amorphous layer by heating the light absorption layer by irradiating the light onto the light absorption layer from the another surface of the support substrate, and by conducting heat of the light absorption layer to the amorphous layer and to the another layer.

12. The heating method according to claim 1,
wherein, the heating partially forms a crystallized amorphous layer in the amorphous layer, and grows a crystal grain in the partially crystallized amorphous layer.

13. The method according to claim 1,
wherein, the forming forms the amorphous layer so that the amorphous layer contacts the one surface of the light absorption layer.

14. The method according to claim 1,
wherein, the forming forms the amorphous layer on the one surface of the light absorption layer via another layer.

15. The method according to claim 1, further comprising:
forming another amorphous layer on the amorphous layer,
heating the lower electrode film by irradiating the laser beam light that passes through the support substrate onto the lower electrode film from the another surface of the support substrate with a temperature that can crystallizes the another amorphous layer to form an another complex oxide film,
repeating the forming and heating a necessary amount of times to laminate a plurality of layers of the complex oxide film.

16. A light irradiation device that crystallizes an amorphous layer formed on a lower electrode film, said lower electrode film being a light absorption layer formed on one surface of a support substrate that is made of silicon, the light absorption layer being a heat resistant film having a melting point of greater than or equal to 1000° C., and the light absorption layer being any one of a metal film including any one metal of Pt, Ir, Pd, Rh, W, Fe, Ni, Ta, Cr, Zr, Ti, and Au; a metal alloy film including any one metal alloy of Pt, Ir, Pd, Rh, W, Fe, Ni, Ta, Cr, Zr, Ti, and Au; and a laminated film that is formed by selecting the metal film or the metal alloy film, and by laminating a plurality of the selected films, comprising:
a device control unit so as to control:
a light emitter provided to the light irradiation device to emit laser beam light that passes through the support substrate onto the lower electrode film from another surface of the support substrate with a temperature that can crystallize the amorphous layer to form a complex oxide film, the temperature being above a crystallization temperature of the amorphous layer and below a melting point of the light absorption layer, and
wherein the another surface of the support substrate is a surface opposite to the one surface of the support substrate, and the device control unit further controls the light emitter to emit a laser beam of fixed power, irrespective of the thickness of the amorphous layer, wherein the support substrate is formed on another surface of the light absorption layer, and the device control unit further controls the light emitter so that a heating area of the lower electrode film is a limited area by focusing the laser beam light that is irradiated onto the another surface of the light absorption layer, and absorbing 90% or more of light energy of laser beam light that enters the support substrate by the light absorption layer.

* * * * *